United States Patent
Park et al.

(10) Patent No.: US 7,651,906 B2
(45) Date of Patent: Jan. 26, 2010

(54) INTEGRATED CIRCUIT DEVICES HAVING A STRESS BUFFER SPACER AND METHODS OF FABRICATING THE SAME

(75) Inventors: Jae-Hyun Park, Gyeonggi-do (KR);
Jae-Hee Oh, Gyeonggi-do (KR);
Won-Cheol Jeong, Seoul (KR);
Sang-Jin Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 469 days.

(21) Appl. No.: 11/546,120

(22) Filed: Oct. 11, 2006

(65) Prior Publication Data

US 2009/0166600 A1    Jul. 2, 2009

Related U.S. Application Data

(63) Continuation-in-part of application No. 11/389,996, filed on Mar. 27, 2006, now Pat. No. 7,442,602.

(30) Foreign Application Priority Data

Jun. 20, 2005    (KR) .............................. 2005-53217

(51) Int. Cl.
*H01L 21/8234*    (2006.01)

(52) U.S. Cl. .................. 438/237; 438/202; 438/241; 438/244; 438/303; 438/305; 257/2; 257/3; 257/4; 257/296; 257/E21.537

(58) Field of Classification Search ................. None
See application file for complete search history.

(56) References Cited

U.S. PATENT DOCUMENTS

| | | | |
|---|---|---|---|
| 5,970,336 A | 10/1999 | Wolstenholme et al. | |
| 6,153,890 A * | 11/2000 | Wolstenholme et al. ........ | 257/3 |
| 6,420,725 B1 | 7/2002 | Harshfield ..................... | 257/4 |
| 6,511,862 B2 | 1/2003 | Hudgens et al. ............... | 438/95 |
| 7,291,556 B2 | 11/2007 | Choi et al. | |
| 7,427,531 B2 | 9/2008 | Cho et al. | |
| 2001/0002046 A1 | 5/2001 | Reinberg et al. ............... | 257/3 |
| 2002/0086524 A1 | 7/2002 | Harshfield ..................... | 438/639 |
| 2002/0160551 A1 | 10/2002 | Harshfield ..................... | 438/102 |
| 2003/0001230 A1 | 1/2003 | Lowrey | |
| 2003/0071255 A1 | 4/2003 | Xu | |
| 2005/0029587 A1 | 2/2005 | Harshfield | |
| 2005/0042862 A1* | 2/2005 | Zahorik ....................... | 438/639 |
| 2005/0248035 A1 | 11/2005 | Son et al. | |

FOREIGN PATENT DOCUMENTS

| | | |
|---|---|---|
| EP | 1 696 441 A1 | 8/2006 |
| EP | 1 710 804 A2 | 10/2006 |
| KR | 1020050011059 | 1/2005 |

OTHER PUBLICATIONS

Office Action for the corresponding Korean Patent Application No. 10-2005-0053217; Date of mailing Jul. 31, 2006.

(Continued)

*Primary Examiner*—N Drew Richards
*Assistant Examiner*—Kyoung Lee
(74) *Attorney, Agent, or Firm*—Myers Bigel Sibley & Sajovec

(57) ABSTRACT

Integrated circuit devices include an integrated circuit substrate and an insulating layer on the integrated circuit substrate. A contact hole penetrates the insulating layer. A vertical diode is in the contact hole and a stress buffer spacer is provided between the vertical diode and the insulating layer. Methods of forming the integrated circuit devices are also provided.

43 Claims, 20 Drawing Sheets

OTHER PUBLICATIONS

Chinese Office Action (10 pages) corresponding to Chinese Patent Application No. 200610089834.X.; Mailing Date: Dec. 4, 2008.
English Translation of Chinese Office Action (9 pages) corresponding to Chinese Patent Application No. 200610089834.X.
Office Action for corresponding German Application dated Apr. 30, 2008.
Office Action for corresponding Chinese Application dated Apr. 4, 2008.
Office Action for corresponding German Application No. 10 2006 028 971.4-33; dated Jun. 21, 2007.

* cited by examiner

INTEGRATED CIRCUIT DEVICES HAVING A STRESS BUFFER SPACER AND METHODS OF FABRICATING THE SAME

CROSS-REFERENCE TO RELATED APPLICATIONS

This application is a continuation-in-part of U.S. patent application Ser. No. 11/389,996, filed Mar. 27, 2006, now U.S. Pat. No. 7,442,602 which is related to and claims priority from Korean Patent Application No. 10-2005-53217, filed Jun. 20, 2005, in the Korean Intellectual Property Office. The disclosures of all of the above applications are hereby incorporated herein in their entirety by reference.

BACKGROUND OF THE INVENTION

The present invention relates to semiconductor memory devices and methods of fabricating the same and, more particularly, to phase change memory devices and methods of fabricating the same.

Nonvolatile memory devices retain their stored data even when their power supplies are turned off. As such, nonvolatile memory devices have been widely used in conjunction with computers, mobile telecommunication systems, memory cards and so on. For example, one widely used type of nonvolatile memory device is the flash memory device. Many flash memory devices employ memory cells having a stacked gate structure. The stacked gate structure of a flash memory device typically includes a tunnel oxide layer, a floating gate, an inter-gate dielectric layer and a control gate electrode, which are sequentially stacked on a channel region. Further, to enhance the reliability and programming efficiency of flash memory cells, the film quality of the tunnel oxide layer may be improved and the coupling ratio of the flash memory cell may be increased.

Recently, other types of nonvolatile memory devices, for example, phase change memory devices, are being used in place of flash memory devices in some applications. A unit cell of a phase change memory device typically includes a cell switching device and a phase change resistor electrically connected to the cell switching device. The phase change resistor typically includes a top electrode and a bottom electrode as well as a phase change material layer between the top and bottom electrodes. The cell switching device may be an active device, such as a Metal-Oxide-Silicon (MOS) transistor. In this case, a large program current of at least a few milli-ampere (mA) is generally required to program the phase change memory cell, and the program currents are supplied through the cell MOS transistor. As such, there may be limits as to how much the area that the cell MOS transistor occupies may be reduced. In other words, when a MOS transistor is employed as the switching device of the phase change memory cell, it may be difficult to enhance the integration density of the phase change memory device.

In an attempt to enhance integration density of a phase change memory device, a vertical diode has been used as the cell switching device of the phase change memory device. A phase change memory cell having the vertical diode is described in U.S. Pat. No. 6,511,862 B2 to Hudgens et al., entitled "Modified Contact for Programmable Devices." As described in Hudgens et al., an isolation layer is formed in a predetermined region of a semiconductor substrate to define an active region, and a word line and a vertical cell diode are formed in the active region. A contact, such as a metal silicide layer, is then formed on the vertical cell diode, and an insulating layer is formed on the substrate having the contact. The insulating layer is patterned to form an opening that exposes the contact, and a spacer and a confined programmable material layer (i.e., a confined phase change material layer) are formed in the opening.

In the process of Hudgens et al., the opening may be misaligned with the vertical cell diode, and the phase change material layer is in direct contact with the metal silicide layer. Therefore, there may be still a limit to how much the phase change memory cell size may be reduced. In addition, the metal silicide layer may react with the phase change material layer during a subsequent annealing process, which may degrade the properties of the phase change material layer.

SUMMARY OF THE INVENTION

Embodiments of the present invention include integrated circuit devices including an integrated circuit substrate and an insulating layer on the integrated circuit substrate. A contact hole penetrates the insulating layer. A vertical diode is in the contact hole and a stress buffer spacer is provided between the vertical diode and the insulating layer.

In other embodiments, the insulating layer includes a first insulating layer on the integrated circuit substrate and a second insulating layer on the first insulating layer. The second insulating layer has an etch selectivity with respect to the first insulating layer.

In further embodiments, a bottom electrode is positioned in the contact hole on the vertical diode. The bottom electrode may be self-aligned with the vertical diode. A top surface of the bottom electrode may have a lower level than a top surface of the insulating layer. A diode electrode may be positioned between the vertical diode and the bottom electrode. The device may further include a phase change material pattern on the bottom electrode and a top electrode on the phase change material pattern. The stress buffer spacer may extend to surround an outer sidewall of the bottom electrode and the bottom electrode may have a top surface area that is less than a horizontal section area of the contact hole. An insulating spacer may be positioned between the bottom electrode and the stress buffer spacer.

In other embodiments, the insulating layer is a high density plasma (HDP) oxide layer. The stress buffer spacer may be a material layer that is more porous than the insulating layer. The stress buffer spacer may be a low pressure chemical vapor deposition (LPCVD) oxide layer. The LPCVD oxide layer may be a medium temperature oxide (MTO) layer. The vertical diode may be a single crystalline semiconductor.

In yet other embodiments, methods of fabricating an integrated circuit device include forming an insulating layer on an integrated circuit substrate. A cell contact hole is formed penetrating the insulating layer. A stress buffer spacer is formed on a sidewall of the cell contact hole and a vertical diode is formed in the cell contact hole surrounded by the stress buffer spacer.

In further embodiments, forming the insulating layer includes forming a high density plasma (HDP) oxide layer. Forming the stress buffer spacer may include forming a material layer that is more porous than the insulating layer. Forming the stress buffer spacer may include forming the stress buffer layer as an oxide layer using a low pressure chemical vapor deposition (LPCVD) process. The oxide layer may be a medium temperature oxide (MTO) layer.

In other embodiments, forming the vertical diode includes forming the vertical diode from a single crystalline semiconductor. The single crystalline semiconductor may be formed using a selective epitaxial growth (SEG) process. Forming the vertical diode may include forming the vertical cell diode in a lower region of the cell contact hole and forming the vertical diode may be followed by forming a diode electrode in the cell contact hole on a top surface of the vertical diode. Forming the vertical diode may also be followed by forming a bottom electrode in the cell contact hole on the vertical diode.

In yet further embodiments, forming the bottom electrode is preceded by forming an insulating spacer on a sidewall of the cell contact hole above the vertical diode prior to formation of the bottom electrode and forming the bottom electrode includes forming the bottom electrode with the insulating spacer between the bottom electrode and the stress buffer spacer. Forming the insulating layer may include sequentially stacking a lower insulating layer and a sacrificial layer and the method may further include removing the sacrificial layer after formation of the bottom electrode so that the bottom electrode and the stress buffer spacer protrude from the lower insulating layer and planarizing the protruded bottom electrode and the protruded stress buffer spacer. Forming the bottom electrode may be followed by forming a phase change material pattern on the bottom electrode and forming a top electrode on the phase change material pattern.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIGS. 5A through 11A are cross-sectional views taken along line I-I' of FIG. 2 illustrating methods of fabricating phase change memory cells according to some embodiments of the present invention;

FIGS. 5B through 11B are cross-sectional views taken along line II-II' of FIG. 2 illustrating methods of fabricating phase change memory cells according to some embodiments of the present invention;

FIGS. 12A through 15A are cross-sectional views taken along line I-I' of FIG. 2 illustrating methods of fabricating phase change memory cells according to other embodiments of the present invention;

FIGS. 12B through 15B are cross-sectional views taken along line II-II' of FIG. 2 illustrating methods of fabricating phase change memory cells according to other embodiment of the present invention;

DETAILED DESCRIPTION OF EMBODIMENTS OF THE INVENTION

Figure 1:
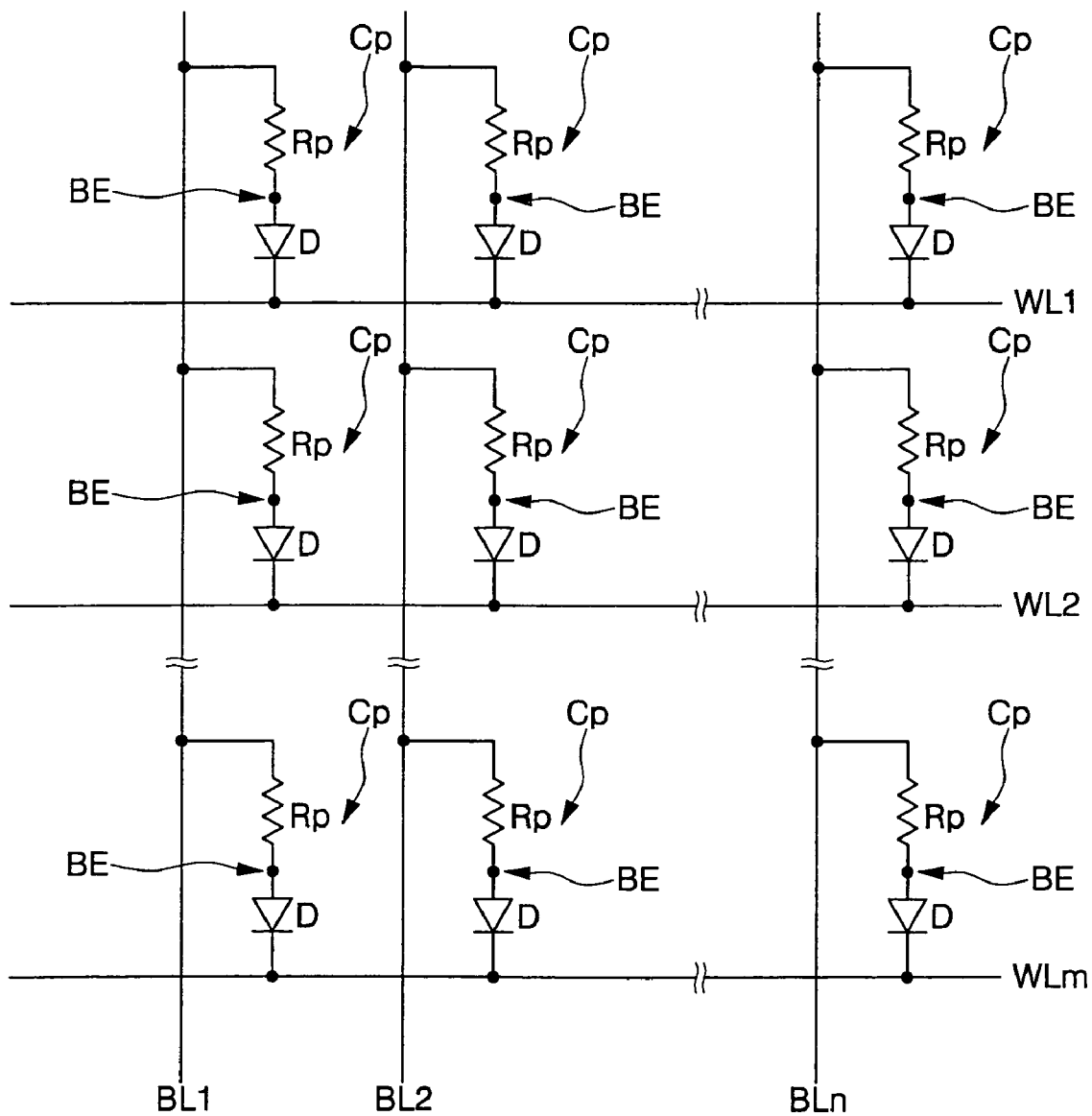
FIG. 1 is an equivalent circuit diagram illustrating a portion of a phase change memory cell array region that may be implemented according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is an equivalent circuit diagram illustrating a portion of a phase change memory cell array region that may be implemented using some embodiments of the present invention. As illustrated in FIG. 1, the phase change memory cell array region includes n bit lines BL1, BL2, ..., BLn, and m word lines WL1, WL2, ..., WLm crossing the bit lines BL1, BL2, ..., BLn. A plurality of two dimensionally arrayed phase change memory cells Cp are disposed at cross points of the bit lines BL1, BL2, ..., BLn and the word lines WL1, WL2, ..., WLm, respectively. Each of the phase change memory cells Cp includes a phase change resistor Rp and a vertical cell diode D, which are electrically connected in series. A node between the phase change resistor Rp and the vertical cell diode D is identified as a bottom electrode BE of the phase change resistor Rp in the embodiments of FIG. 1. The vertical cell diode D may include a p-type semiconductor and an n-type semiconductor.

The p-type semiconductor of the cell diode D may be electrically connected to one end of the phase change resistor Rp, and the other end of the phase change resistor Rp may be electrically connected to any one of the bit lines BL1, BL2, ..., BLn. The n-type semiconductor of the cell diode D may be electrically connected to any one of the word lines WL1, WL2, ..., WLm.

Figure 2:
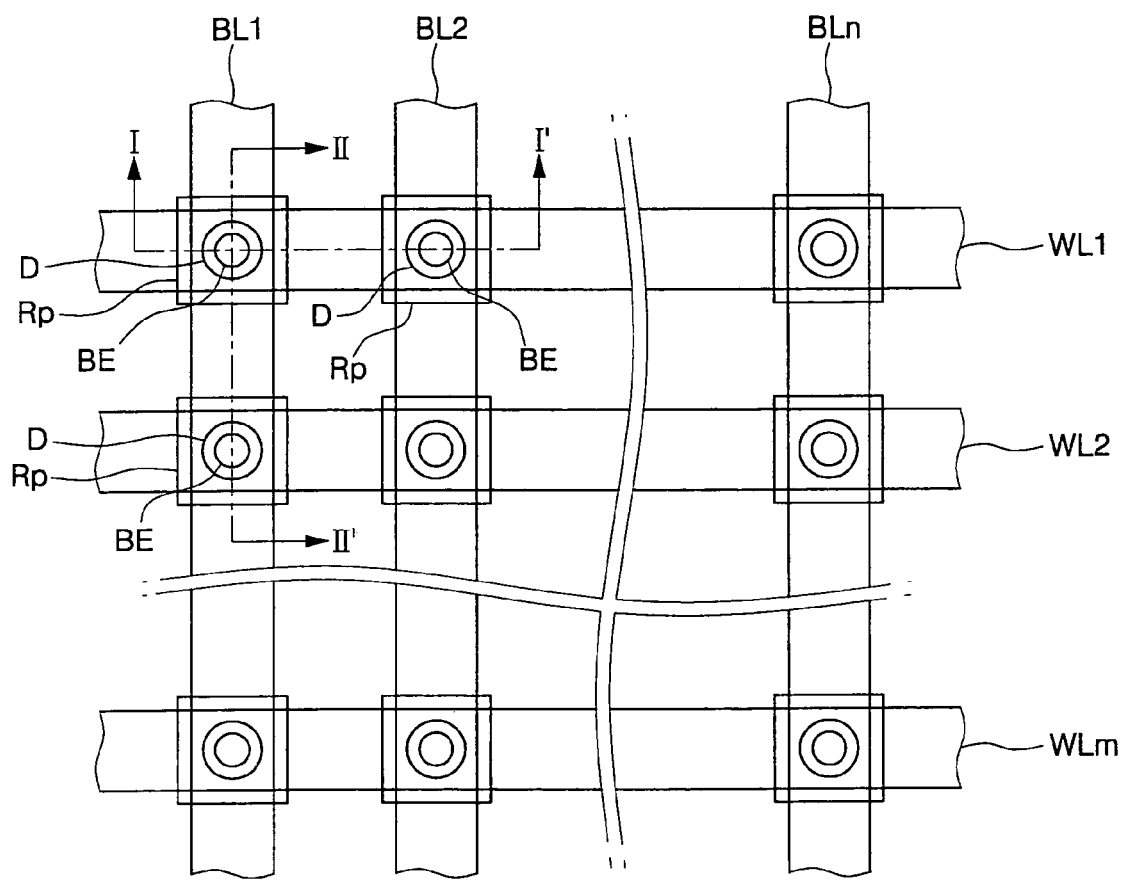
FIG. 2 is a plan view corresponding to the equivalent circuit diagram of FIG. 1 according to some embodiments of the present invention.
Figure 3A:
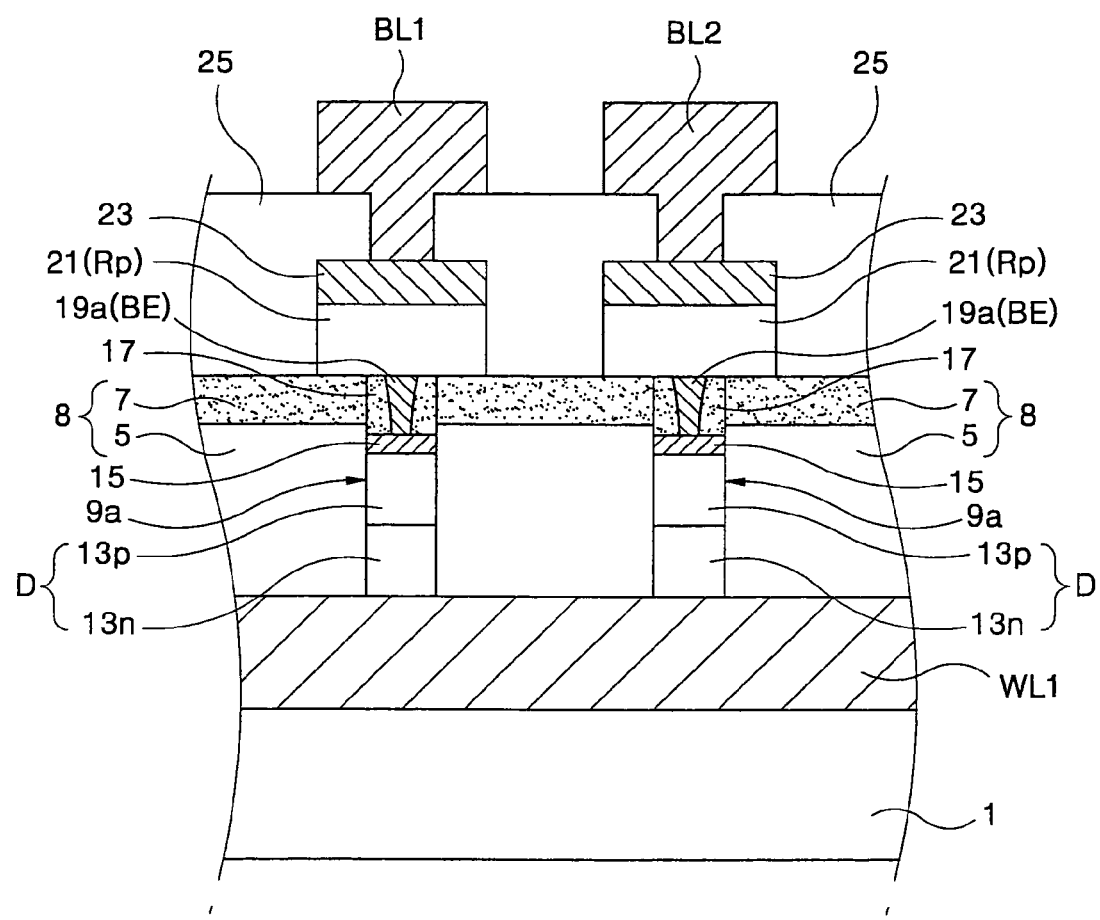
FIG. 3A is a cross-sectional view taken along line I-I' of FIG. 2 illustrating phase change memory cells according to some embodiments of the present invention.

Some embodiments of the present invention will now be further described with reference to FIGS. 2, 3A and 3B. FIG. 2 is a plan view of the phase change memory cell array region corresponding to the equivalent circuit diagram of FIG. 1 according to some embodiments of the present invention. FIG. 3A is a cross-sectional view taken along line I-I' of FIG. 2 and FIG. 3B is a cross-sectional view taken along line II-II' of FIG. 2.

Figure 3B:
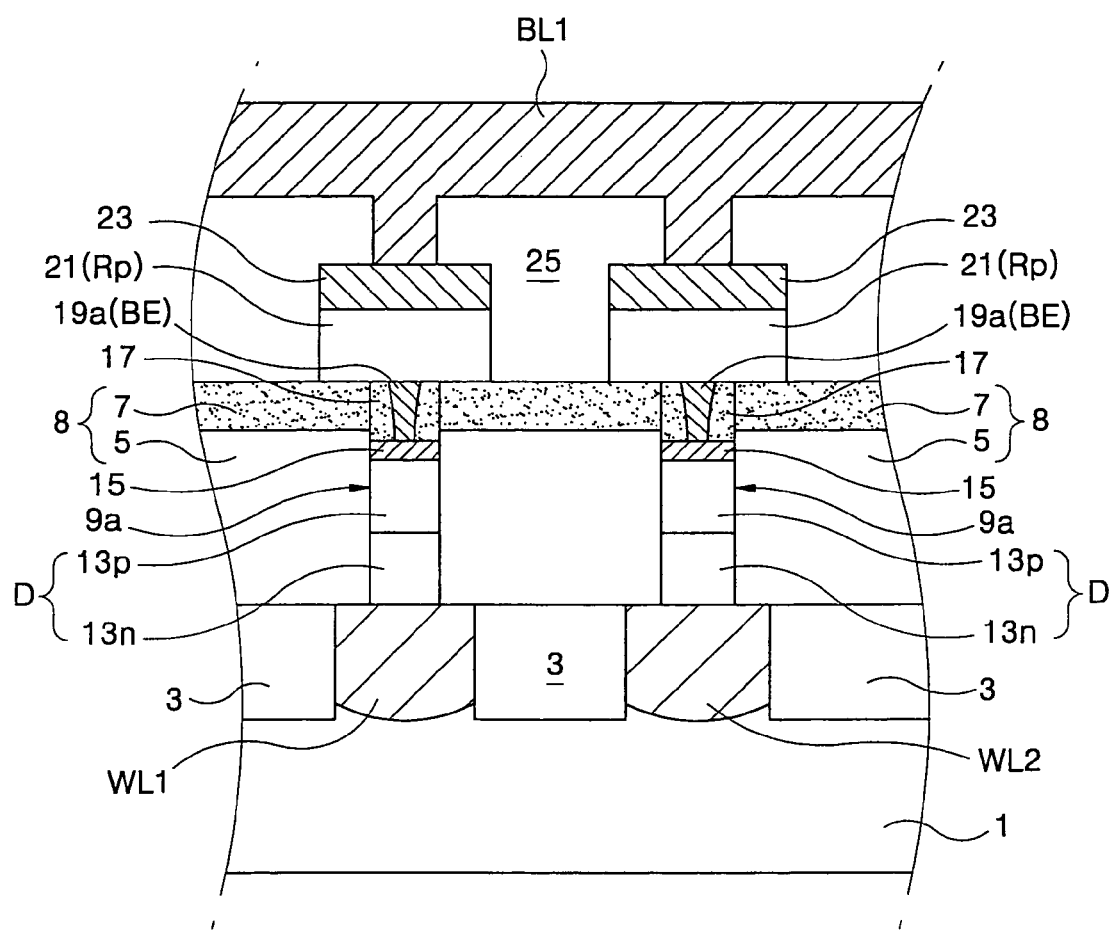
FIG. 3B is a cross-sectional view taken along line II-II' of FIG. 2 illustrating phase change memory cells according to some embodiments of the present invention.

Referring now to FIGS. 2, 3A and 3B, a plurality of word lines, for example, first and second parallel word lines WL1 and WL2, are provided on a semiconductor substrate 1. The word lines WL1 and WL2 may be active regions doped with n-type impurities. The word lines WL1 and WL2 may be electrically insulated from each other by an insulating layer, such as an isolation layer 3.

A lower insulating layer 8 is provided on the substrate 1 including the word lines WL1 and WL2. The lower insulating layer 8 may include a stacked first lower insulating layer 5 and second lower insulating layer 7. The second lower insulating layer 7 may be an insulating layer having an etch selectivity with respect to the first lower insulating layer 5. For example, the first lower insulating layer 5 may be a silicon oxide layer and the second lower insulating layer 7 may be a silicon oxynitride layer and/or a silicon nitride layer.

Predetermined regions of the word lines WL1 and WL2 are exposed by cell contact holes 9a penetrating the lower insulating layer 8. Lower regions of the cell contact holes 9a are filled with vertical cell diodes D. Each of the vertical cell diodes D may include a stacked n-type semiconductor 13n and p-type semiconductor 13p. Top surfaces of the vertical cell diodes D may be lower than a top surface of the lower insulating layer 8 as seen in FIG. 3B. Cell diode electrodes 15 may be provided on the top surfaces of the vertical cell diodes D. The cell diode electrodes 15 may be a metal silicide layer, such as a cobalt silicide layer, a nickel silicide layer and/or a titanium silicide layer.

Bottom electrodes 19a (BE of FIGS. 1 and 2) are provided inside the cell contact holes 9a on the vertical cell diodes D. Top surfaces of the bottom electrodes 19a have a substantially same level as the top surface of the lower insulating layer 8. Sidewalls of the bottom electrodes 19a may be surrounded by insulating spacers 17. In the illustrated embodiments, outer sidewalls of the insulating spacers 17 are self-aligned with sidewalls of the vertical cell diodes D by the cell contact holes 9a and the bottom electrodes 19a are self-aligned with the vertical cell diodes D. When the insulating spacers 17 are provided, top surfaces of the bottom electrodes 19a may have smaller areas than horizontal section areas of the cell contact holes 9a. The bottom electrodes 19a may be a conductive layer, such as a titanium nitride (TiN) layer, a titanium aluminum nitride (TiAlN) layer, a tantalum nitride (TaN) layer, a tungsten nitride (WN) layer, a molybdenum nitride (MoN) layer, a niobium nitride (NbN) layer, a titanium silicon nitride (TiSiN) layer, a titanium boron nitride (TiBN) layer, a zirconium silicon nitride (ZrSiN) layer, a tungsten silicon nitride (WSiN) layer, a tungsten boron nitride (WBN) layer, a zirconium aluminum nitride (ZrAlN) layer, a molybdenum aluminum nitride (MoAlN) layer, a tantalum silicon nitride (TaSiN) layer, a tantalum aluminum nitride (TaAlN) layer, a titanium tungsten (TiW) layer, a titanium aluminum (TiAl) layer, a titanium oxynitride (TiON) layer, a titanium aluminum oxynitride (TiAlON) layer, a tungsten oxynitride (WON) layer and/or a tantalum oxynitride (TaON) layer. The insulating spacers 17 may be the same material as the second lower insulating layer 7.

When the insulating spacers 17 are provided, lower surfaces of the bottom electrodes 19a may also have smaller areas than horizontal section areas of the cell contact holes 9a. In this case, if the bottom electrodes 19a directly contact the p-type semiconductors 13p of the vertical cell diodes D, most of the current passing through the bottom electrodes 19a may flow through central portions of the p-type semiconductors 13p. The current crowding effect may degrade a current drivability of the vertical cell diodes D. However, where the cell diode electrodes 15 are provided on the top surfaces of the p-type semiconductors 13p as seen in FIGS. 3A and 3B, the current passing through the bottom electrodes 19a may flow substantially uniformly through the vertical cell diodes D due to the presence of the cell diode electrodes 15. That is, the cell diode electrodes 15 may improve the current drivability of the vertical cell diodes D.

The bottom electrodes 19a are shown covered with phase change material patterns 21. The phase change material patterns 21 correspond to the phase change resistors Rp shown in FIGS. 1 and 2. The phase change material patterns 21 may be a chalcogenide layer, such as a GST alloy layer (an alloy layer of germanium, stibium and tellurium). Respective top electrodes 23 are shown disposed on the phase change material patterns 21. The top electrodes 23 may be a conductive layer, such as a titanium nitride layer.

An upper insulating layer 25 is provided on the substrate having the phase change material patterns 21 and the top electrodes 23. A plurality of bit lines, for example, first and second parallel bit lines BL1 and BL2, are disposed on the upper insulating layer 25. The bit lines BL1 and BL2 may be disposed to cross over the word lines WL1 and WL2. The bit lines BL1 and BL2 may be electrically connected to the top electrodes 23 through bit line contact holes penetrating the upper insulating layer 25.

Figure 4A:
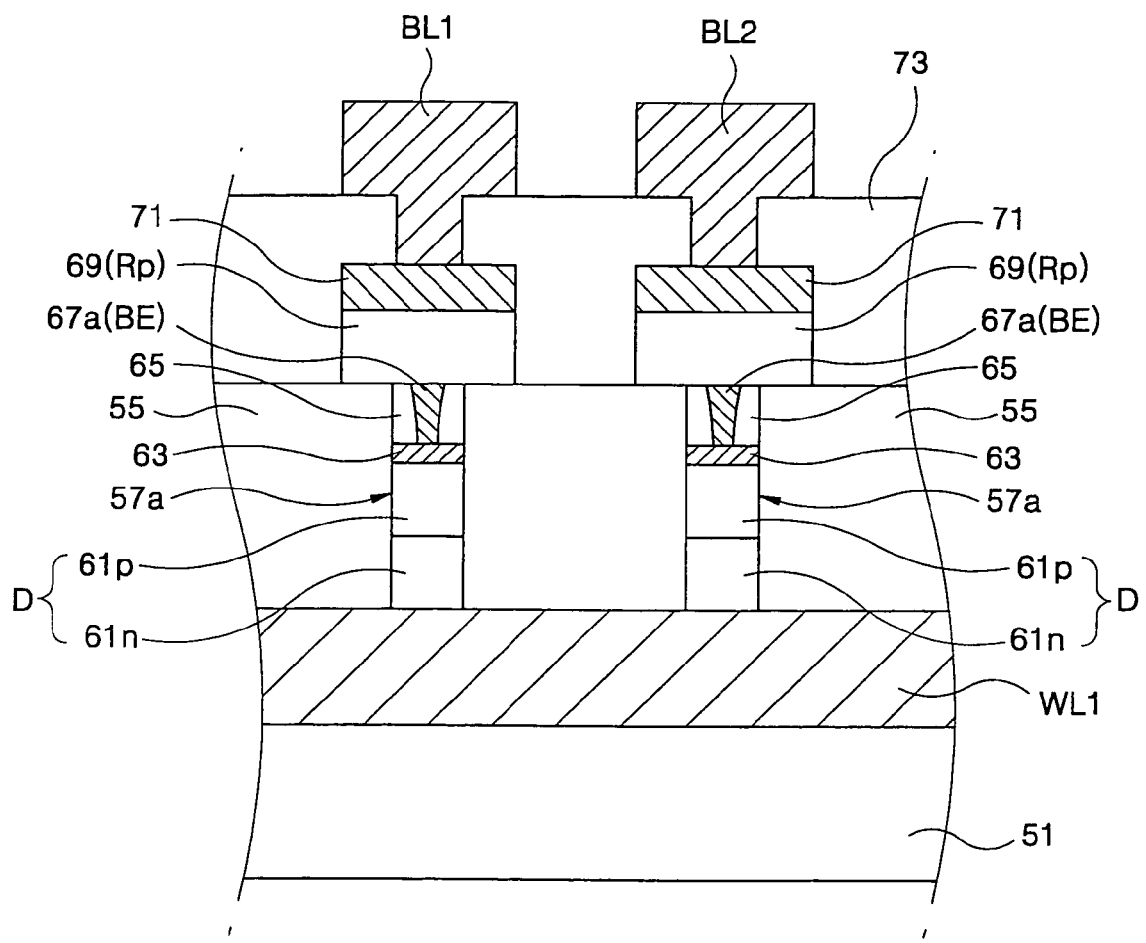
FIG. 4A is a cross-sectional view taken along line I-I' of FIG. 2 illustrating phase change memory cells according to other embodiments of the present invention.
Figure 4B:
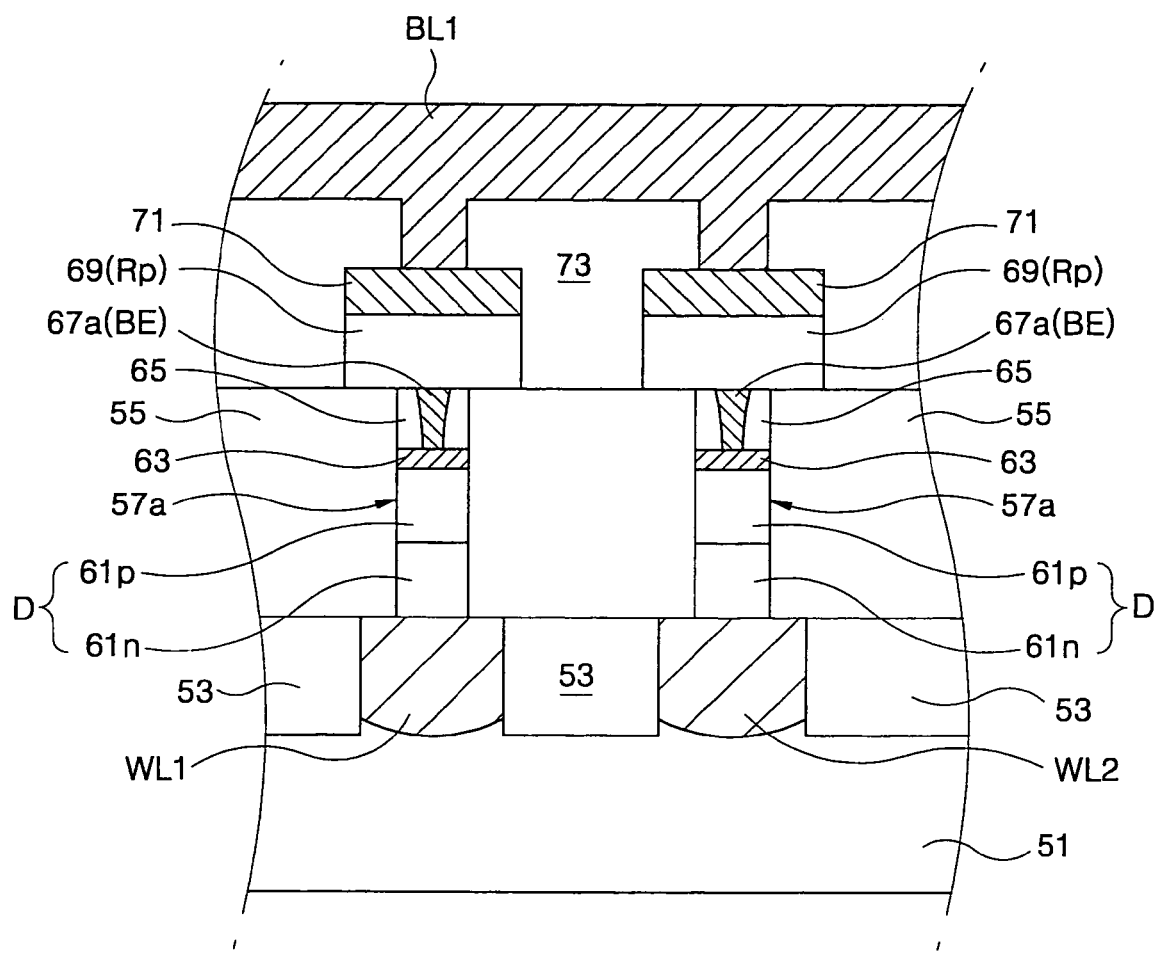
FIG. 4B is a cross-sectional view taken along line II-II' of FIG. 2 illustrating phase change memory cells according to other embodiments of the present invention.

Further embodiments of the present invention will now be described with reference to FIGS. 2, 4A and 4B. FIG. 4A is a cross-sectional view taken along line I-I' of FIG. 2 and FIG. 4B is a cross-sectional view taken along line II-II' of FIG. 2. Referring to FIGS. 4A and 4B, a plurality of word lines, for example, first and second word lines WL1 and WL2, are disposed on a semiconductor substrate 51. The word lines WL1 and WL2 may have the same shape as the word lines described with reference to FIGS. 3A and 3B. The word lines WL1 and WL2 may be electrically insulated from each other by an insulating layer, such as an isolation layer 53 (FIG. 4B).

A lower insulating layer 55 is provided on the substrate including the word lines WL1 and WL2. In the embodiments of FIGS. 4A and 4B, the lower insulating layer 55 is illustrated as a single insulating layer. The lower insulating layer 55 may be, for example, a single layer of silicon oxide. Predetermined regions of the word lines WL1 and WL2 may be exposed by cell contact holes 57a that penetrate the lower insulating layer 55. Respective vertical cell diodes D are provided inside lower regions of the cell contact holes 57a. Each of the vertical cell diodes D may include a stacked n-type semiconductor 61n and p-type semiconductor 61p, as described with reference to the diodes D of the embodiments of FIGS. 3A and 3B. Cell diode electrodes 63 may be provided on top surfaces of the vertical cell diodes D as described with reference to the electrodes 15 illustrated in FIGS. 3A and 3B. Bottom electrodes 67a (BE of FIGS. 1 and 2) may be provided inside the cell contact holes on the vertical cell diodes D.

Top surfaces of the bottom electrodes 67a have substantially the same level as the top surface of the lower insulating layer 55, as described previously with reference to the bottom electrodes 19a illustrated in FIGS. 3A and 3B. In addition, sidewalls of the bottom electrodes 67a may be surrounded by insulating spacers 65. The insulating spacers 65 and the bottom electrodes 67a are also self-aligned with the vertical cell diodes D by the cell contact holes 57a as described previously with reference the spacers 17 and bottom electrodes 19a illustrated in FIGS. 3A and 3B. When the insulating spacers 65 are provided, bottom surfaces and top surfaces of the bottom electrodes 67a may have smaller areas than horizontal section areas of the cell contact holes 57a. The bottom electrodes 67a may be the same material as the bottom electrodes 19a described with reference to FIGS. 3A and 3B and the insulating spacers 65 may be the same insulating layer material as the lower insulating layer 55.

Each of the bottom electrodes 67a is shown covered with a phase change material pattern 69 corresponding to the phase change resistors Rp. As illustrated in FIGS. 4A and 4B, top electrodes 71 are disposed on the respective phase change material patterns 69. The phase change material patterns 69 and the top electrodes 71 may be substantially the same as the phase change material patterns 21 and the top electrodes 23 described with reference to FIGS. 3A and 3B.

An upper insulating layer 73 is shown disposed on the substrate including the phase change material patterns 69 and the top electrodes 71 and bit lines BL1 and BL2 are provided on the upper insulating layer 73 as described previously with reference to the bit lines on the insulating layer 25 for the embodiment of FIGS. 3A and 3B.

For the embodiments shown in FIGS. 4A and 4B, the bottom electrodes 67a may be surrounded by spacers 65, which may be composed of a silicon oxide layer. The single lower insulating layer 55 may also be composed of a silicon oxide layer. In general, a silicon oxide layer exhibits lower heat conductivity than that of a silicon oxynitride layer or a silicon nitride layer. Thus, when program current flows through the bottom electrodes 67a, loss of the joule heat generated from the bottom electrodes 67a may be relatively reduced as compared to the embodiments described with reference to FIGS. 3A and 3B. As a result, a program efficiency of the phase change material patterns 69 may be improved.

Methods of fabricating phase change memory cells according to some embodiments of the present invention will now be described with reference to FIG. 2, FIGS. 5A through 11A and FIGS. 5B through 11B. FIGS. 5A through 11A are cross-sectional views taken along line I-I' of FIG. 2 and FIGS. 5B through 11B are cross-sectional views taken along line II-II' of FIG. 2.

Figure 5A:
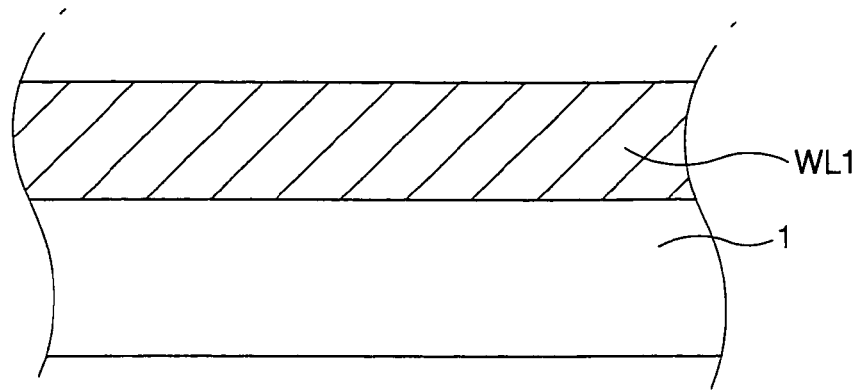
Figure 5B:
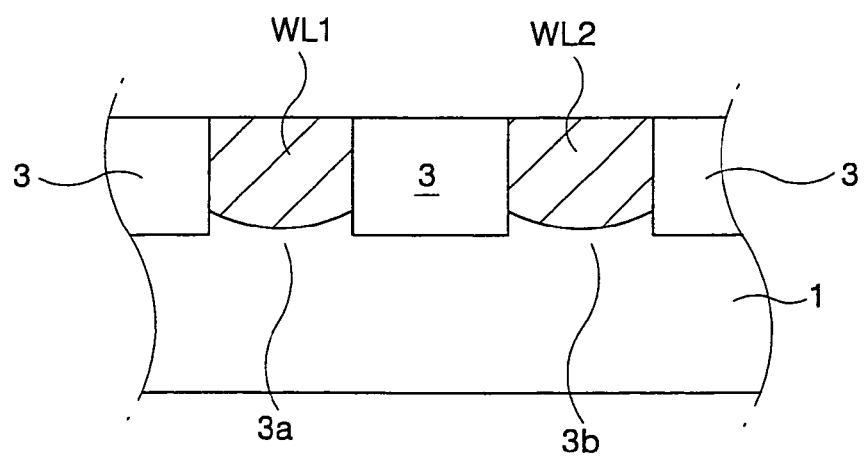

Referring first to FIGS. 5A and 5B, an isolation layer 3 is formed on a predetermined region of a semiconductor substrate 1 to define a plurality of active regions, for example, first and second parallel active regions 3a and 3b. Impurity ions having a different conductivity type from the semiconductor substrate 1 are implanted into the active regions 3a and 3b to form first and second word lines WL1 and WL2. As a result, the word lines WL1 and WL2 may be impurity regions having a different conductivity type from the semiconductor substrate 1. For example, when the semiconductor substrate 1 is a p-type semiconductor substrate, the word lines WL1 and WL2 may be formed by implanting n-type impurity ions.

In some embodiments, the word lines WL1 and WL2 may be formed using various other methods. For example, formation of the word lines WL1 and WL2 may include forming a plurality of parallel epitaxial semiconductor patterns on the semiconductor substrate 1 and implanting impurity ions into the epitaxial semiconductor patterns.

Figure 6A:
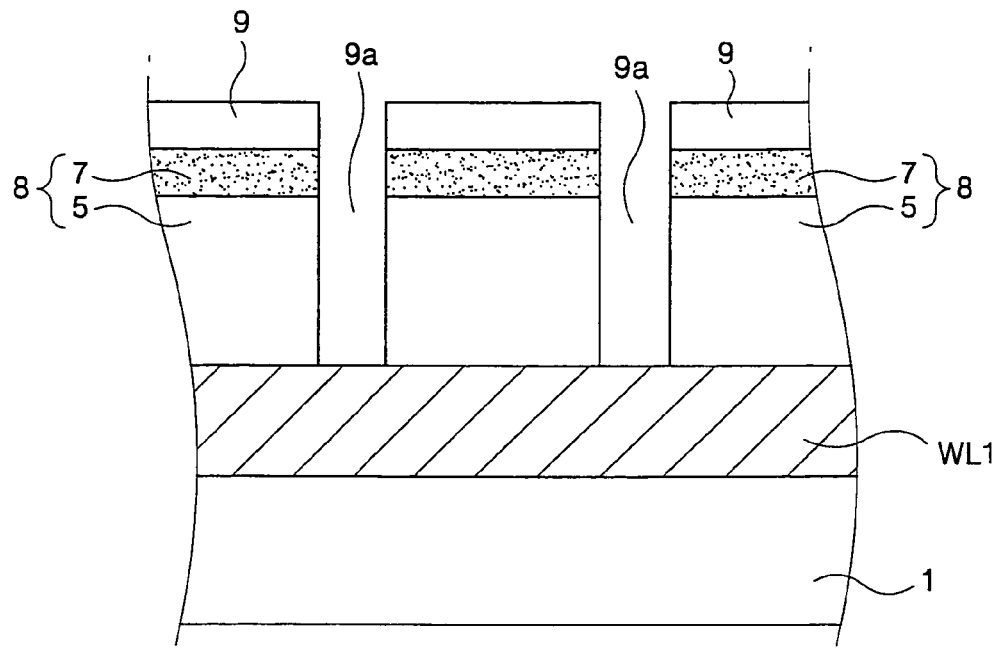
Figure 6B:
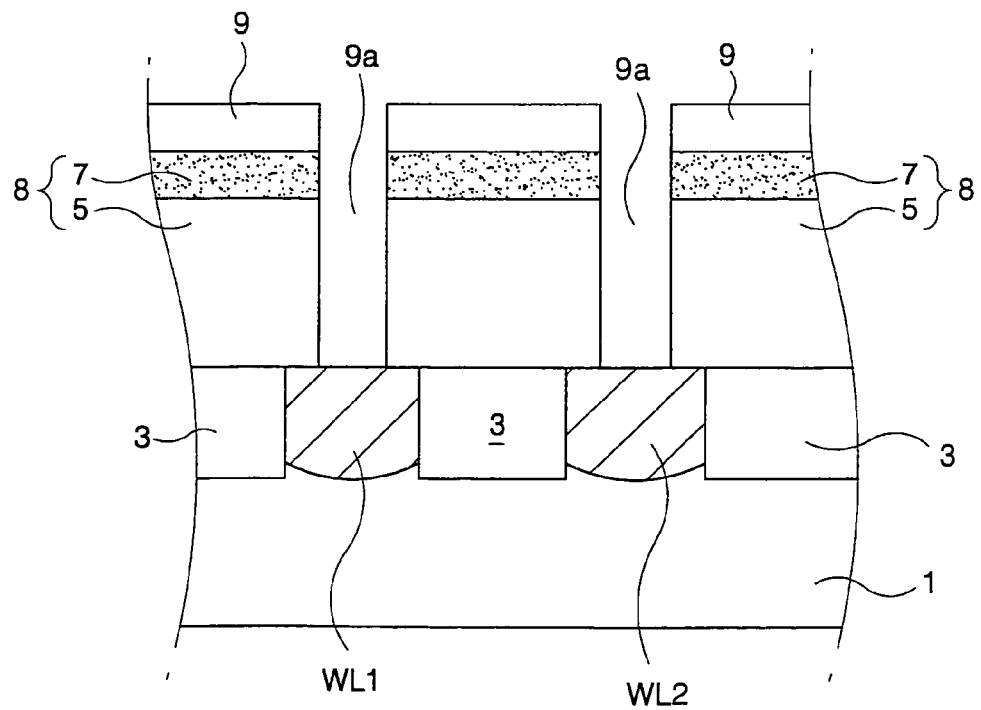

Referring now to FIGS. 6A and 6B, a lower insulating layer 8 and a sacrificial layer 9 are sequentially formed on the substrate 1 in a region including the word lines WL1 and WL2. The lower insulating layer 8 may be formed by sequentially stacking a first lower insulating layer 5 and a second lower insulating layer 7. The sacrificial layer 9 may be formed of a material layer having an etch selectivity with respect to the second lower insulating layer 7. The second lower insulating layer 7 may be formed of an insulating layer having an etch selectivity with respect to the first lower insulating layer 5. For example, the first lower insulating layer 5 and the sacrificial layer may be formed of a silicon oxide layer, and the second lower insulating layer 7 may be formed of a silicon oxynitride layer and/or a silicon nitride layer. The sacrificial layer 9 and the lower insulating layer 8 are patterned to form cell contact holes 9a exposing predetermined regions of the word lines WL1 and WL2.

Figure 7A:
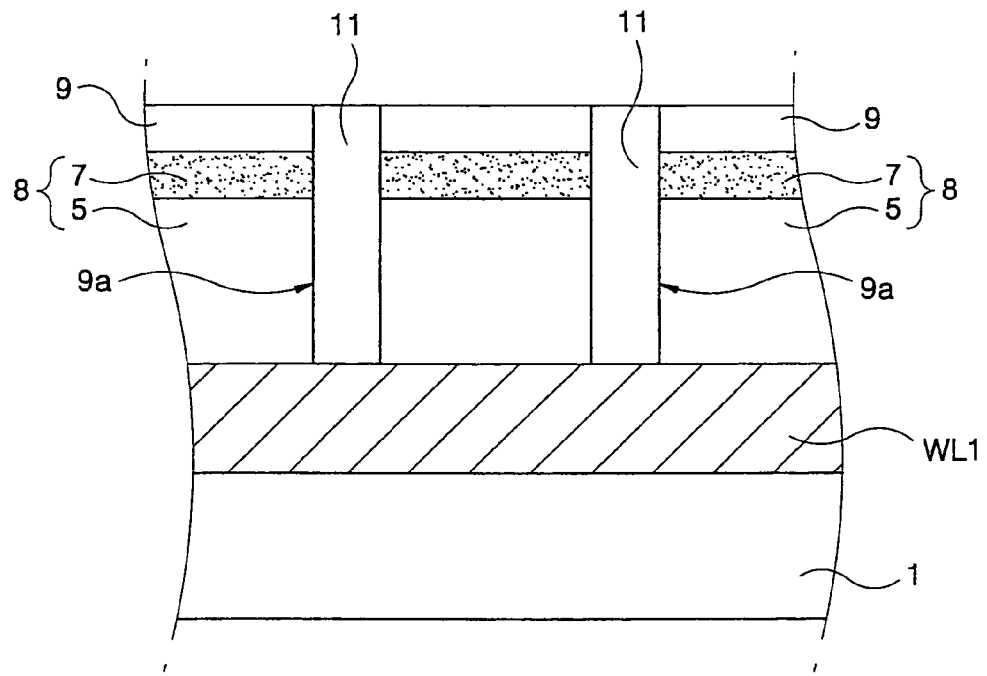
Figure 7B:
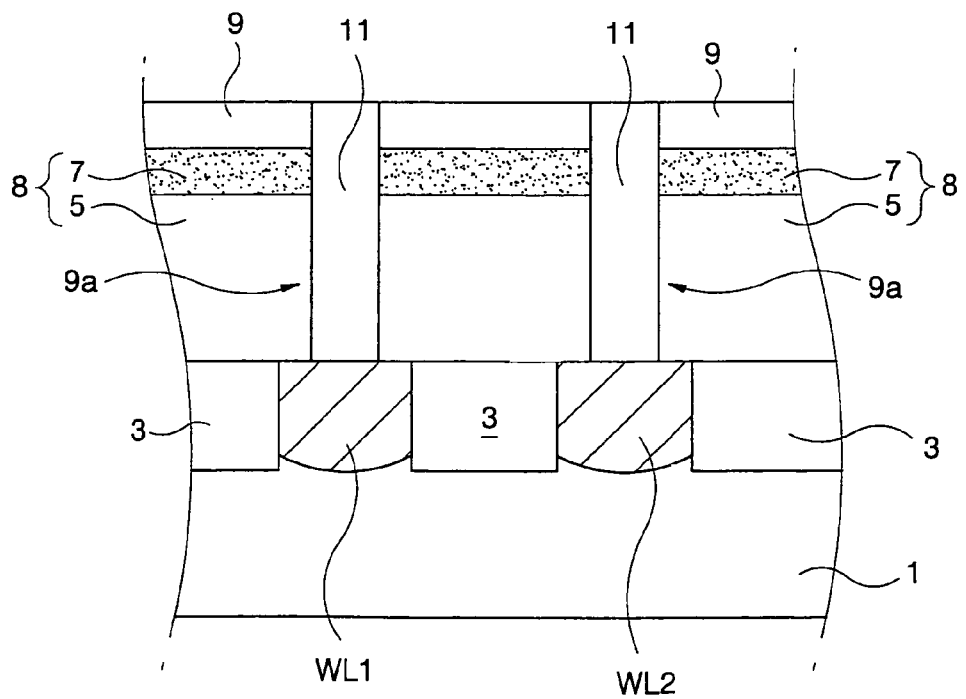

Referring to FIGS. 7A and 7B, semiconductor patterns 11, such as silicon patterns, germanium patterns and/or silicon germanium patterns, are formed in the respective cell contact holes 9a. The semiconductor patterns 11 may be formed using various methods. For example, the semiconductor patterns 11 may be formed using a selective epitaxial growth (SEG) technique that employs the exposed word lines WL1, WL2 as a seed layer. In other embodiments, formation of the semiconductor patterns 11 may include forming a semiconductor layer that fills the cell contact holes 9a on the sacrificial layer 9 and planarizing the semiconductor layer until a top surface of the sacrificial layer 9 is exposed. In this case, the semiconductor layer may be formed of an amorphous semiconductor layer and/or a polycrystalline semiconductor layer, and the semiconductor layer may be crystallized using a solid phase epitaxial (SPE) technique before or after planarization of the semiconductor layer. When the selective epitaxial growth technique or the solid phase epitaxial technique is used in formation of the semiconductor patterns 11, the word lines WL1 and WL2 may be impurity regions formed in the single crystalline semiconductor substrate 1.

Figure 8A:
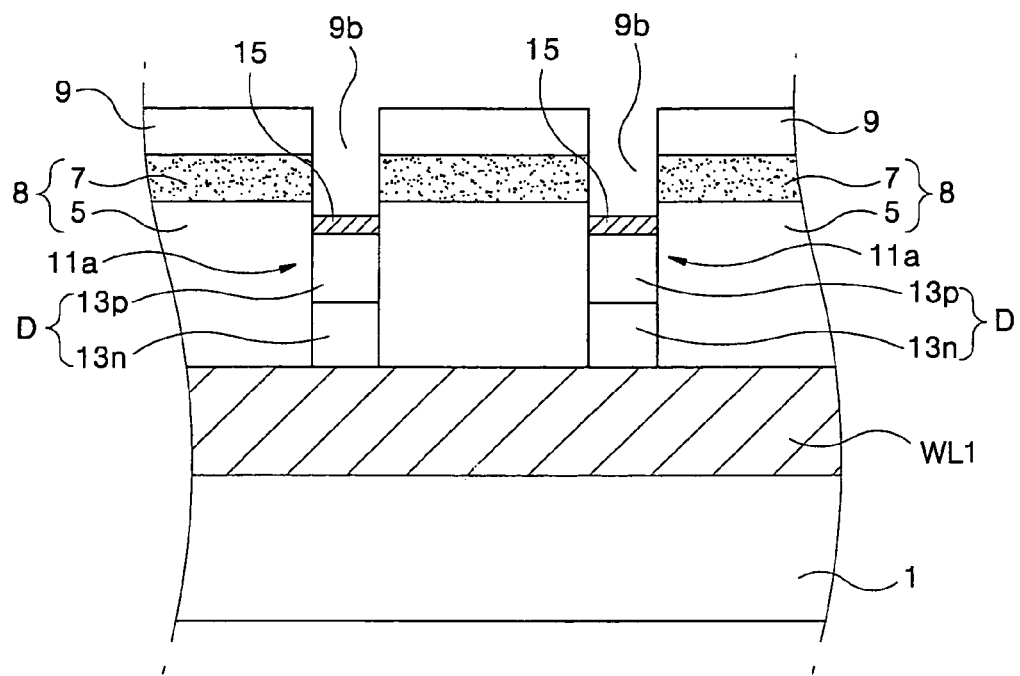
Figure 8B:
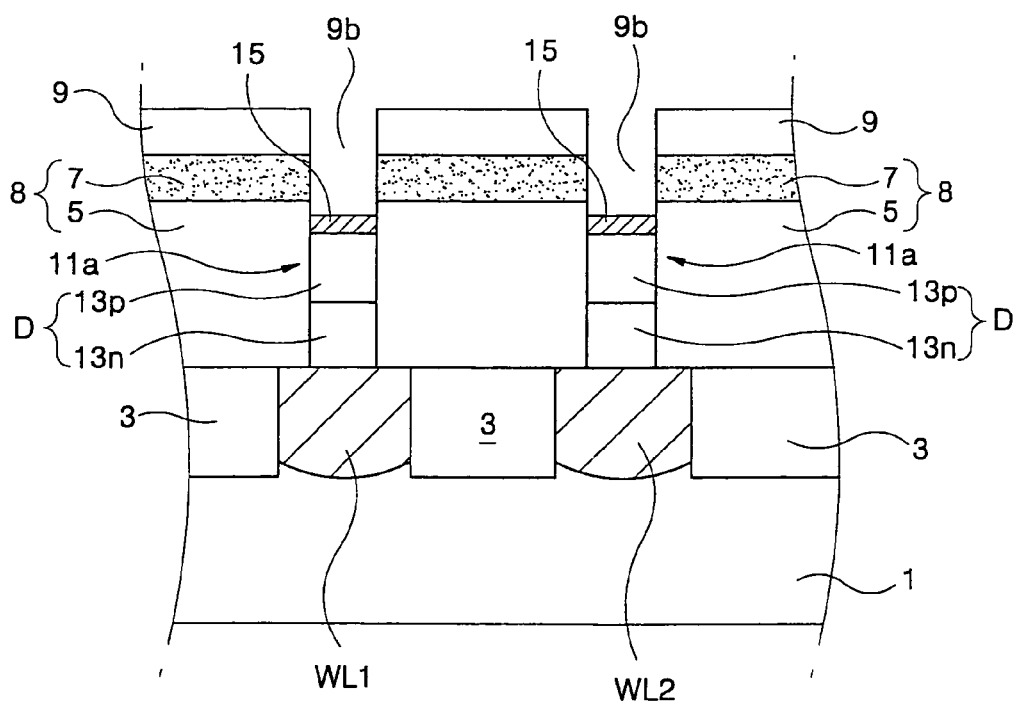

Referring now to FIGS. 8A and 8B, the semiconductor patterns 11 are etched back to form recessed semiconductor patterns 11a that exist in lower regions of the cell contact holes 9a. The recessed semiconductor patterns 11a may be formed to have top surfaces at a level lower than a top surface of the lower insulating layer 8 (that is, a top surface of the second lower insulating layer 7). As a result, upper cell contact holes 9b are provided on the recessed semiconductor patterns 11a.

N-type impurity ions may be implanted into lower regions of the recessed semiconductor patterns 11a to form n-type semiconductors 13n (e.g., n-type impurity regions) contacting the word lines WL1 and WL2, and p-type impurity ions may be implanted into upper regions of the recessed semiconductor patterns 11a to form p-type semiconductors 13p (e.g., p-type impurity regions) on the n-type semiconductors 13n. As a result, vertical cell diodes D may be formed inside lower regions of the respective cell contact holes 9a. The ion implantation process for forming the n-type semiconductors 13n may be performed after formation of the p-type semiconductors 13p.

Cell diode electrodes 15 may be formed on top surfaces of the vertical cell diodes D (e.g., top surfaces of the p-type semiconductors 13p). The cell diode electrodes 15 may be formed of a metal silicide layer, such as a cobalt silicide layer, a nickel silicide layer and/or a titanium silicide layer. The metal silicide layer may be formed using a salicide technique.

Figure 9A:
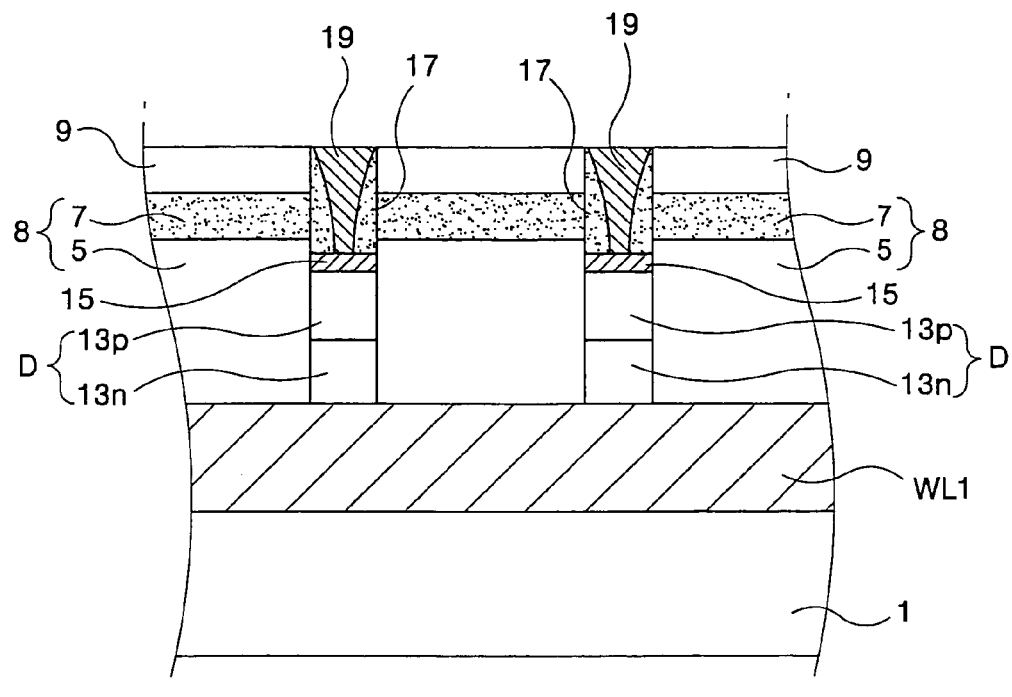
Figure 9B:
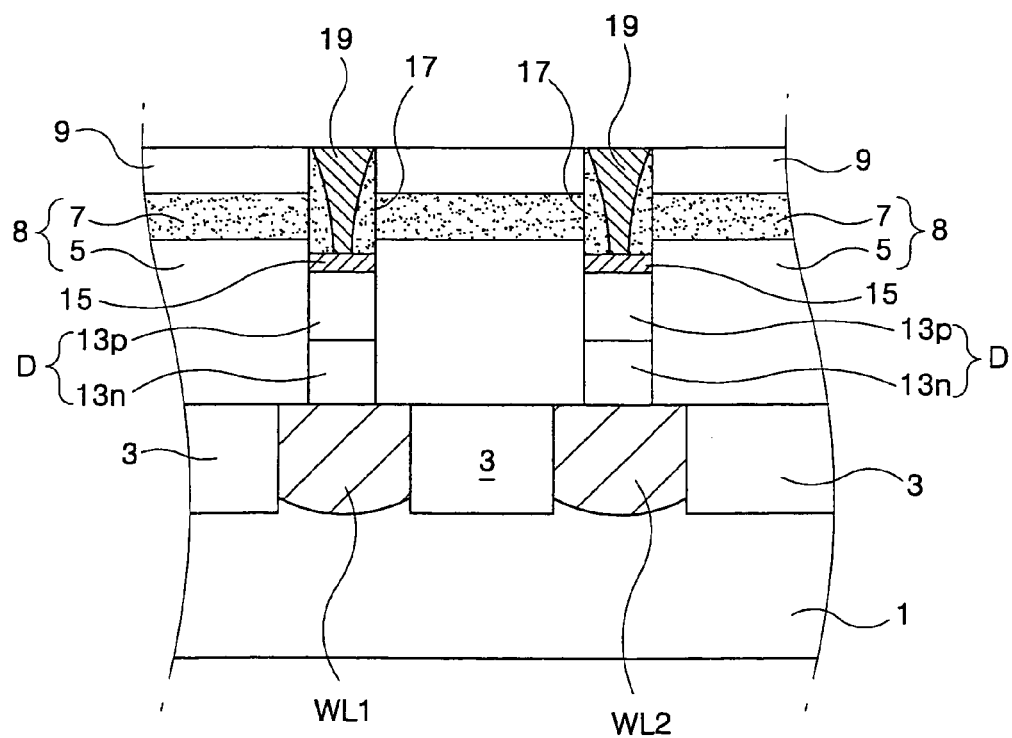

Referring now to FIGS. 9A and 9B, insulating spacers 17 may be formed on sidewalls of the upper cell contact holes (9b of FIGS. 8A and 8B). The insulating spacers 17 may be formed of an insulating layer having an etch selectivity with respect to the sacrificial layer 9. For example, the sacrificial layer 9 may be formed of a silicon oxide layer and the insulating spacers 17 may be formed of a silicon oxynitride layer and/or a silicon nitride layer.

In some embodiments of the present invention, the salicide process for forming the cell diode electrodes 15 may be performed after formation of the insulating spacers 17. In this case, as the insulating spacers 17 directly contact edge portions of the cell diodes 15, the cell diode electrodes 15 are formed on central portions of the cell diodes D, which are exposed after formation of the insulating spacers 17.

A bottom electrode layer is formed on the substrate 1 in a region including the cell diode electrodes 15 and the insulating spacers 17. The bottom electrode layer may be formed of a conductive layer, such as a titanium nitride (TiN) layer, a titanium aluminum nitride (TiAlN) layer, a tantalum nitride (TaN) layer, a tungsten nitride (WN) layer, a molybdenum nitride (MoN) layer, a niobium nitride (NbN) layer, a titanium silicon nitride (TiSiN) layer, a titanium boron nitride (TiBN) layer, a zirconium silicon nitride (ZrSiN) layer, a tungsten silicon nitride (WSiN) layer, a tungsten boron nitride (WBN) layer, a zirconium aluminum nitride (ZrAlN) layer, a molybdenum aluminum nitride (MoAlN) layer, a tantalum silicon nitride (TaSiN) layer, a tantalum aluminum nitride (TaAlN) layer, a titanium tungsten (TiW) layer, a titanium aluminum (TiAl) layer, a titanium oxynitride (TiON) layer, a titanium aluminum oxynitride (TiAlON) layer, a tungsten oxynitride (WON) layer and/or a tantalum oxynitride (TaON) layer. The bottom electrode layer may be planarized to expose a top surface of the sacrificial layer 9. As a result, preliminary bottom electrodes 19 may be formed in empty regions surrounded by the insulating spacers 17, with the preliminary bottom electrodes 19 in contact with central top surfaces of the cell diode electrodes 15.

Figure 10A:
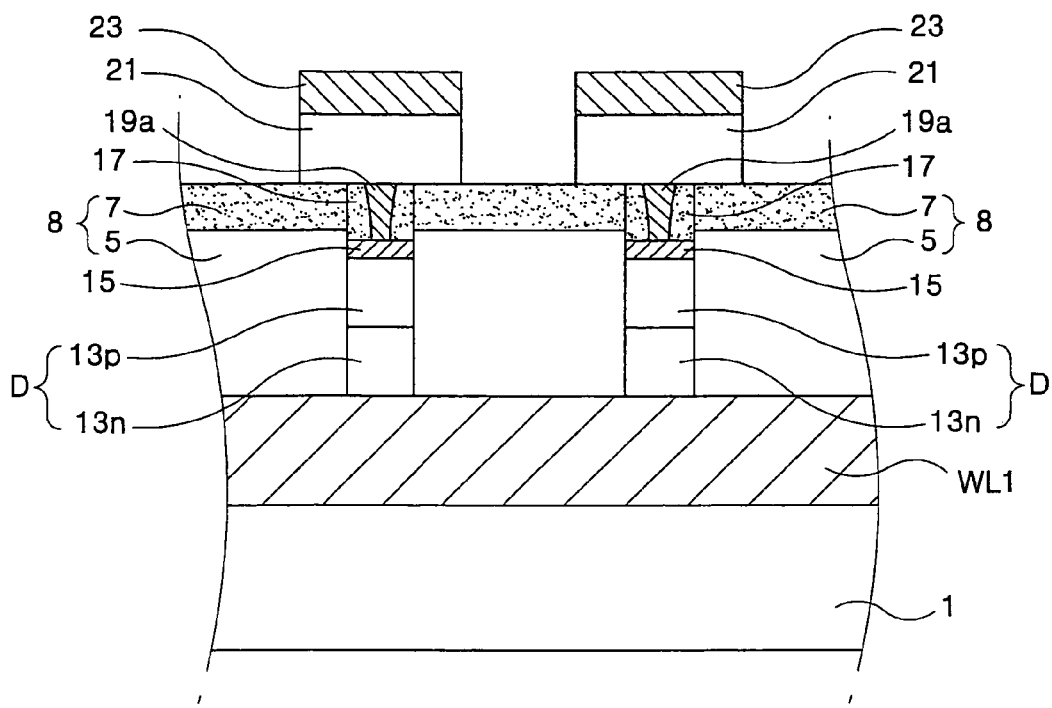
Figure 10B:
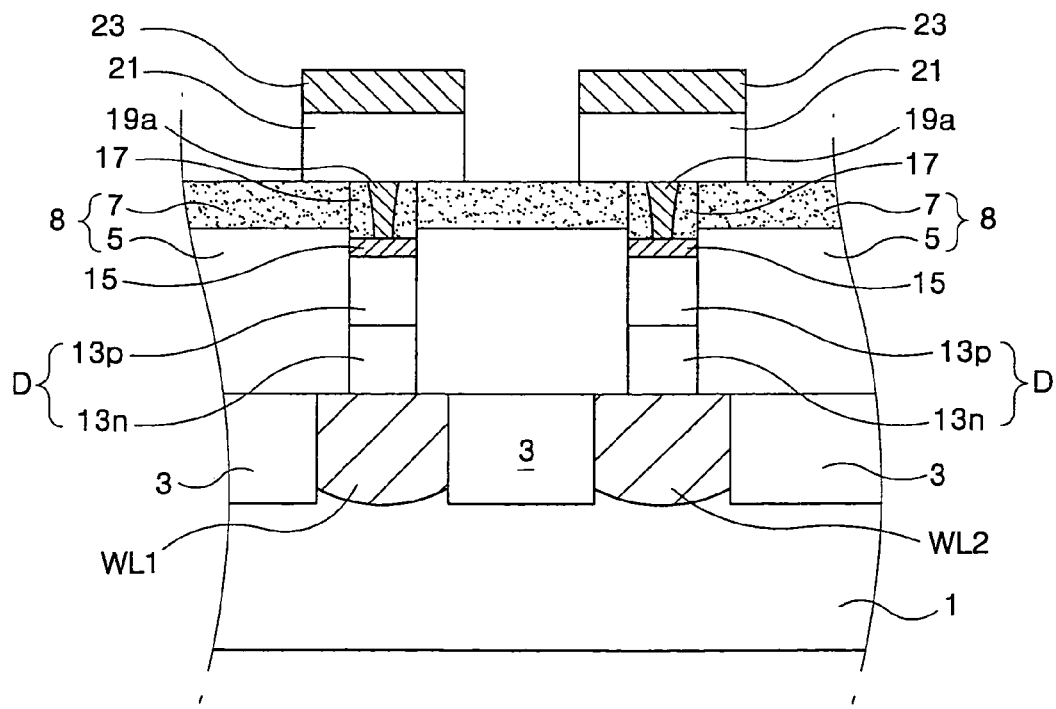

Referring next to FIGS. 10A and 10B, the sacrificial layer (9 of FIGS. 9A and 9B) is removed to expose the second lower insulating layer 7. As a result, the preliminary bottom electrodes 19 and the insulating spacers 17 are relatively protruded. The protruded preliminary bottom electrodes 19 and the protruded insulating spacers 17 may then be planarized using the second lower insulating layer 7 as a polishing stop layer. Thus, bottom electrodes 19a may be formed on the vertical cell diodes D, and top surfaces of the bottom electrodes 19a may have substantially a same level as the top surface of the second lower insulating layer 7. In this case, the top surface areas of the bottom electrodes 19a may be smaller than horizontal section areas of the cell contact holes 9a. Further, the bottom electrodes 19a may be self-aligned with the vertical cell diodes D by the cell contact holes 9a.

A phase change material layer and a top electrode layer are sequentially formed on the substrate 1 in the region including the bottom electrodes 19a. The phase change material layer may be formed of a chalcogenide layer, such as an alloy layer of germanium, stibium and tellurium (GST alloy layer), and the top electrode layer may be formed of a conductive layer, such as a titanium nitride layer. Further, the phase change material layer may be formed using a physical vapor deposition technique, such as a sputtering technique that exhibits poor step coverage. Nevertheless, the phase change material layer may be formed to a uniform thickness throughout the semiconductor substrate 1 as the substrate having the bottom electrodes 19a may have a flat surface. The top electrode layer and the phase change material layer are patterned to form a plurality of phase change material patterns 21 covering the bottom electrodes 19a. Top electrodes 23 may be stacked on the phase change material patterns 21.

Figure 11A:
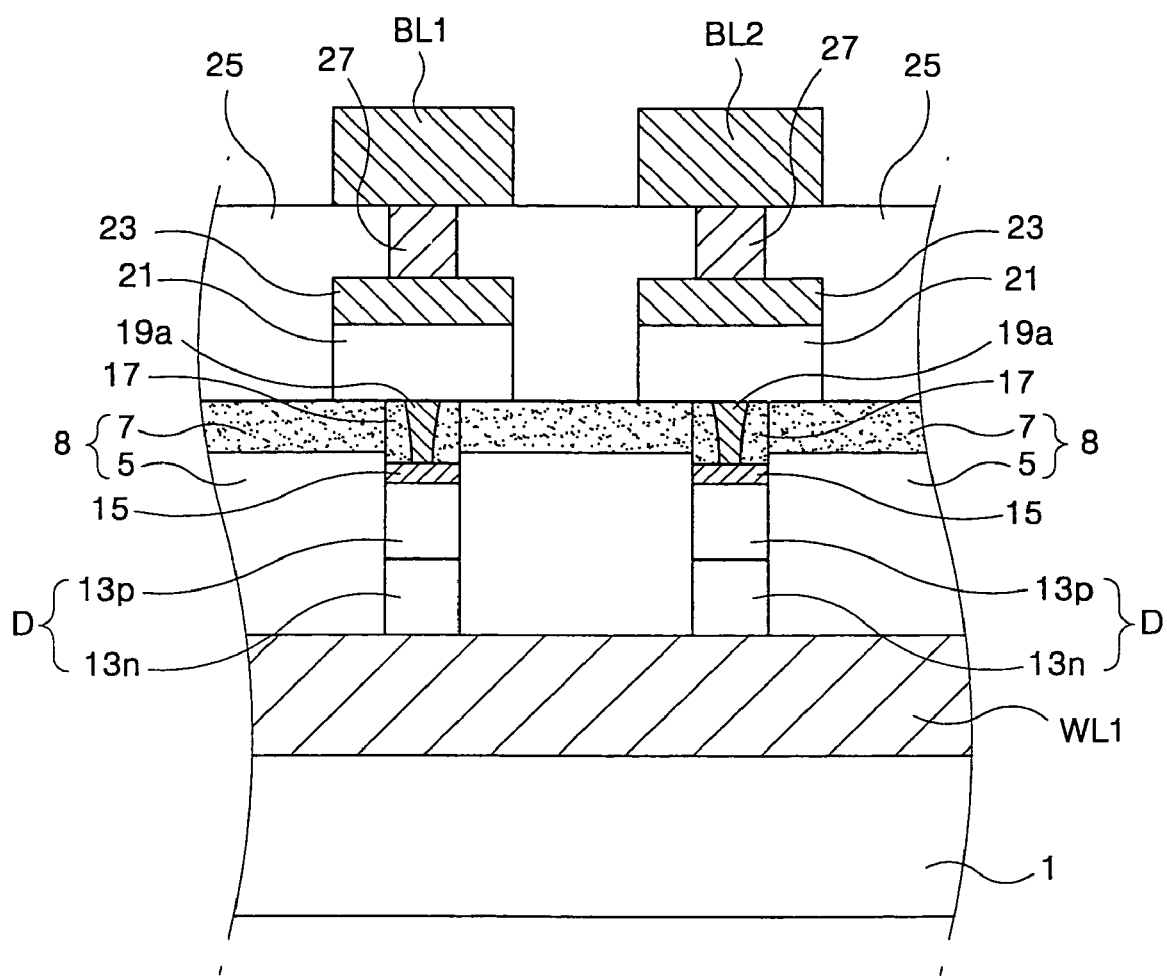
Figure 11B:
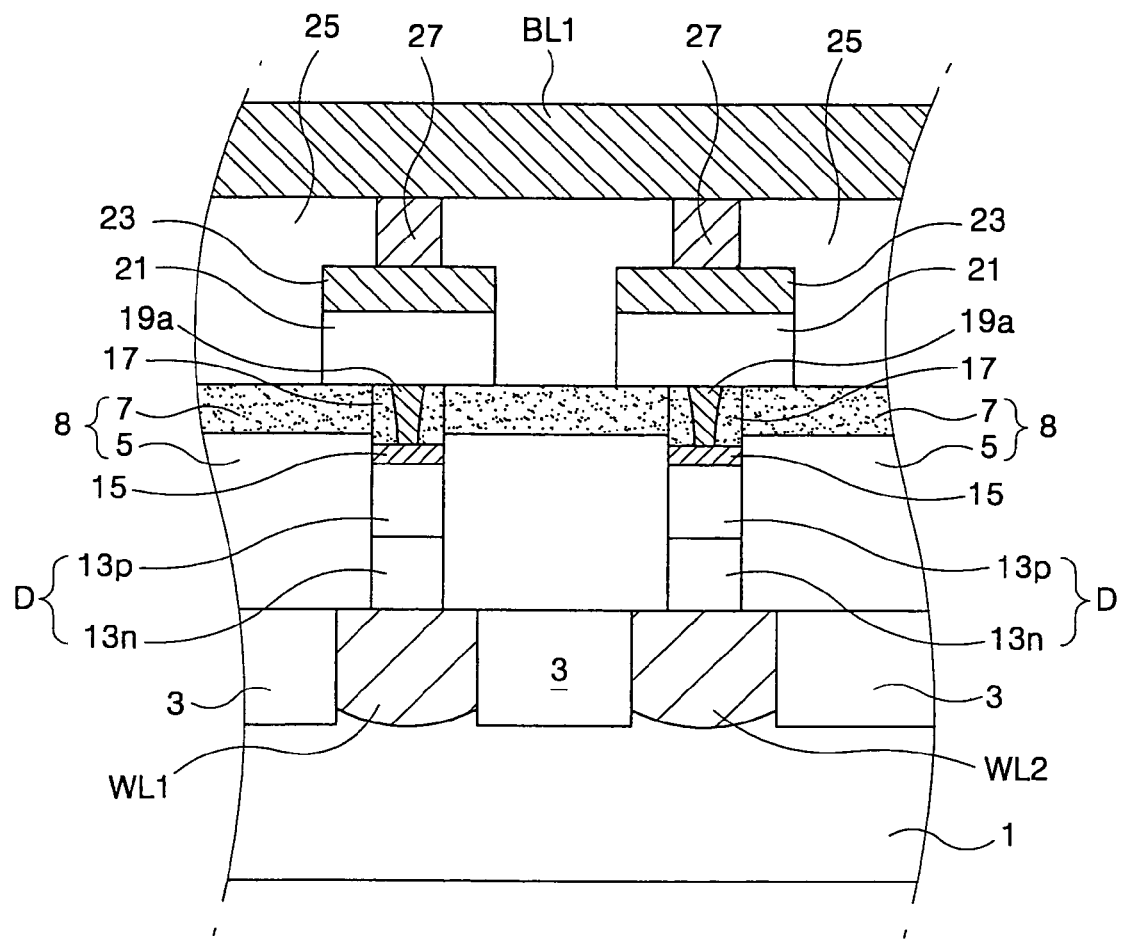

Referring now to FIGS. 11A and 11B, an upper insulating layer 25 is formed on the substrate 1 in the region including the top electrodes 23. The upper insulating layer 25 is patterned to form bit line contact holes exposing the top electrodes 23. Bit line contact plugs 27 are formed in the bit line contact holes and a plurality of bit lines BL1 and BL2 are formed that contact the bit line contact plugs 27. The bit lines BL1 and BL2 may be formed to cross over the word lines WL1 and WL2.

Methods of fabricating phase change memory cells according to other embodiments of the present invention will now be described with reference to FIG. 2 and FIGS. 12A through 15B. FIGS. 12A through 15A are cross-sectional views taken along line I-I' of FIG. 2 and FIGS. 12B through 15B are cross-sectional views taken along line II-II' of FIG. 2.

Figure 12A:
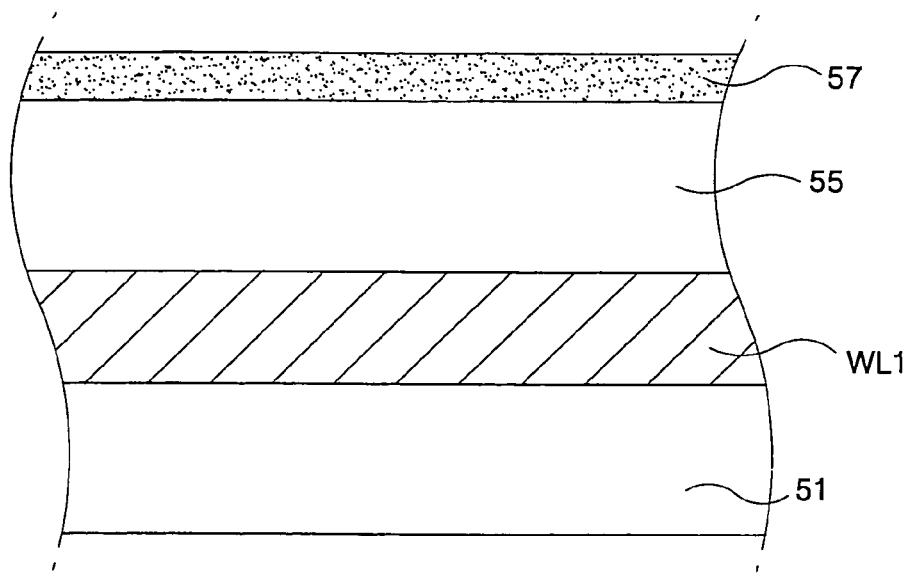
Figure 12B:
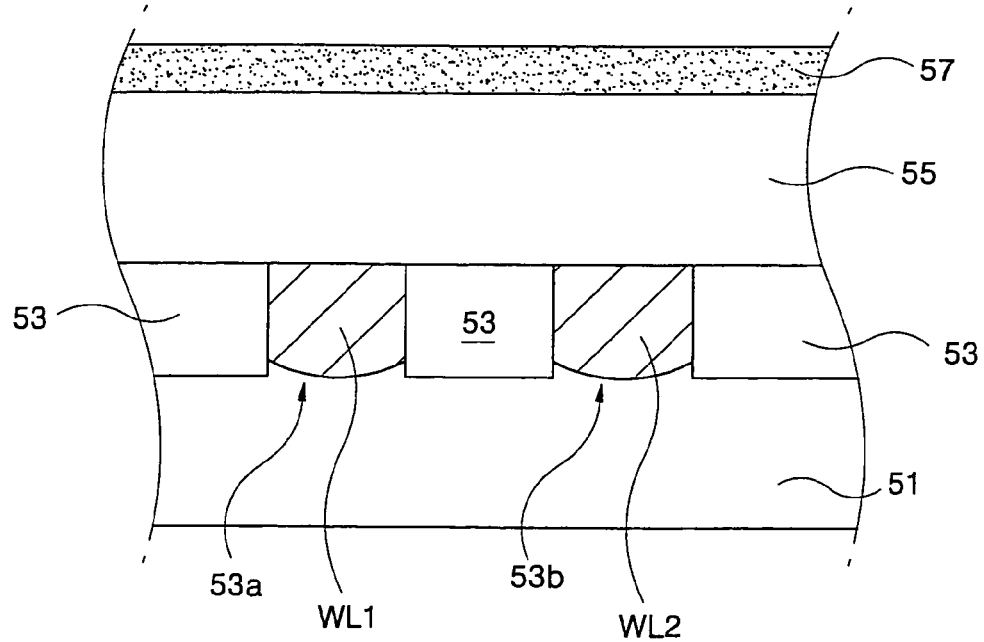

Referring to FIGS. 12A and 12B, a plurality of word lines WL1 and WL2 with an insulating layer 53 therebetween may be formed using substantially the same method as described with reference to FIGS. 5A and 5B. A lower insulating layer 55 and a sacrificial layer 57 are formed on the substrate 51 in a region including the word lines WL1 and WL2. In the illustrated embodiments of FIGS. 12A and 12B, the lower insulating layer 55 is formed of a single lower insulating layer. The lower insulating layer 55 may be formed, for example, of a single silicon oxide layer. The sacrificial layer 57 may be formed of a material layer having an etch selectivity with respect to the lower insulating layer 55. For example, the sacrificial layer 57 may be formed of a silicon oxynitride layer and/or a silicon nitride layer.

Figure 13A:
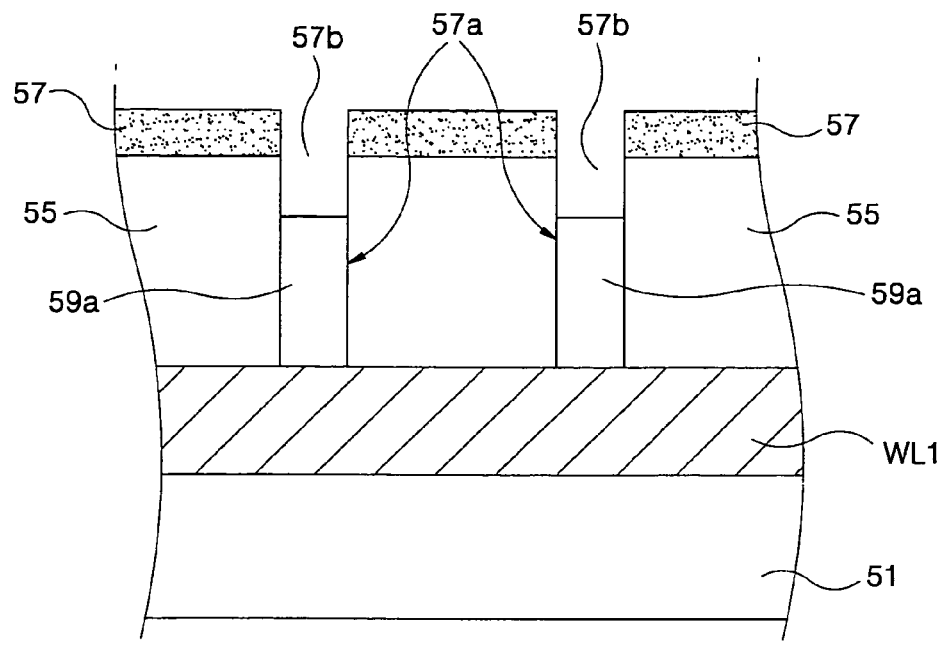
Figure 13B:
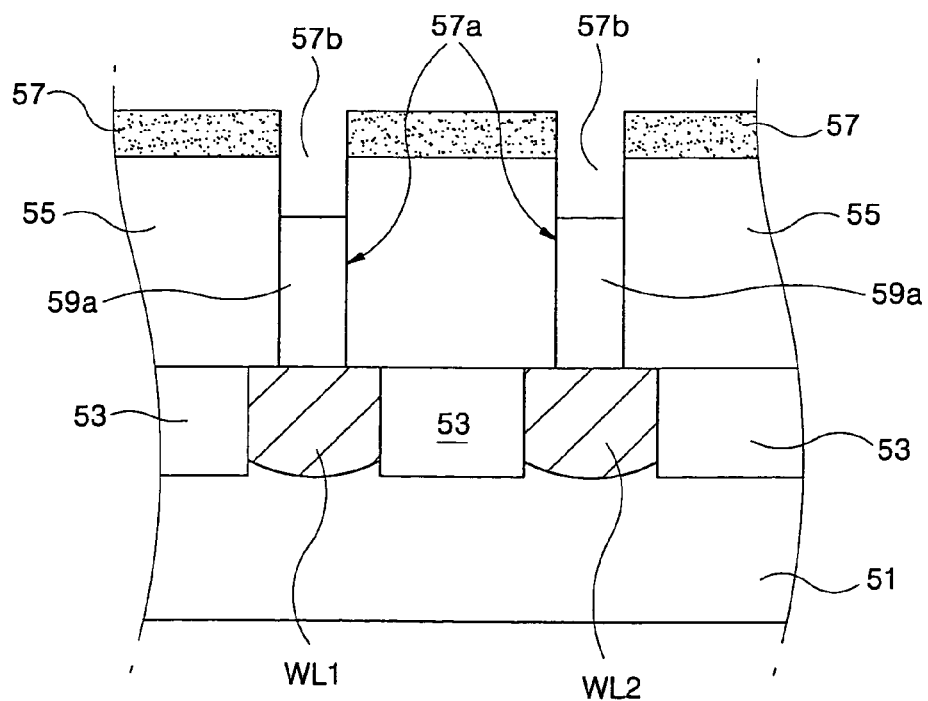

Referring next to FIGS. 13A and 13B, the sacrificial layer 57 and the lower insulating layer 55 are patterned to form cell contact holes 57a exposing predetermined regions of the word lines WL1 and WL2. Recessed semiconductor patterns 59a may be formed in lower regions of the cell contact holes 57a using substantially the same method as described with reference to FIGS. 7A, 7B, 8A and 8B. The recessed semiconductor patterns 59a may be formed to have lower surfaces than a top surface of the lower insulating layer 55. As a result, upper cell contact holes 57b may be provided on the recessed semiconductor patterns 59a.

Figure 14A:
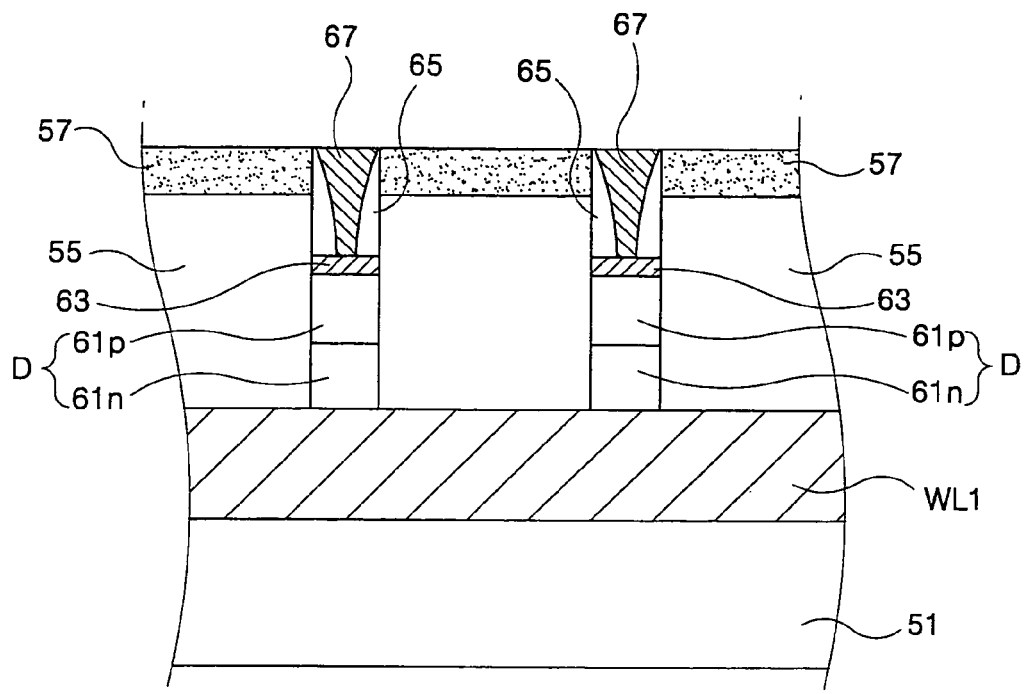
Figure 14B:
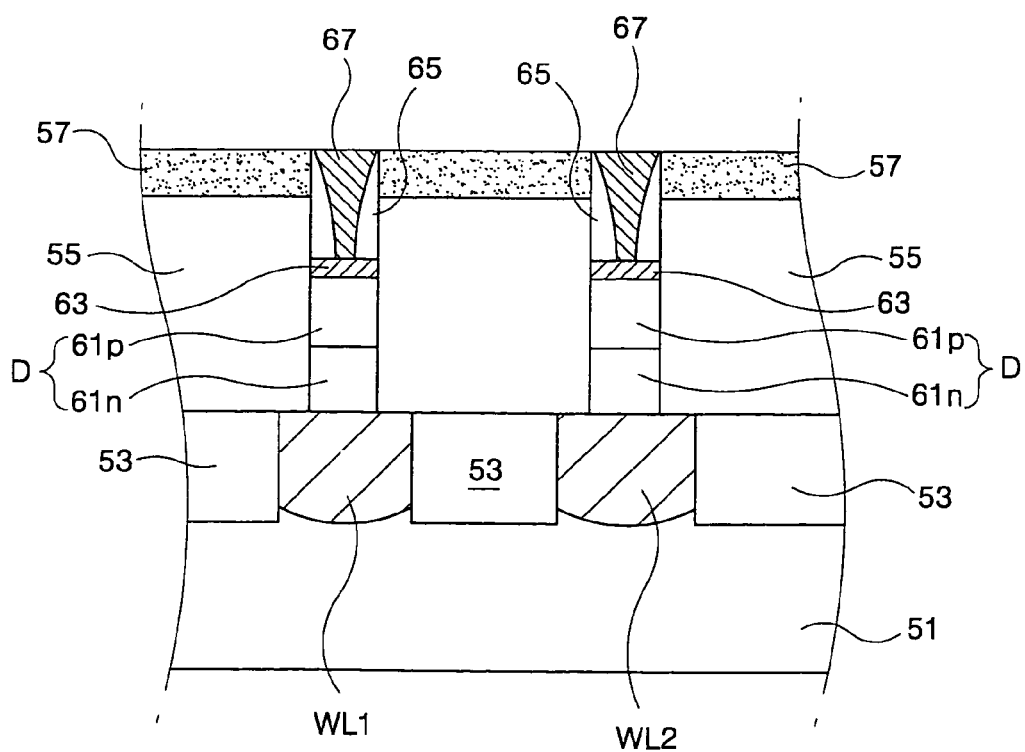

Referring now to FIGS. 14A and 14B, impurity ions may be implanted into the recessed semiconductor patterns 59a to form vertical cell diodes D. The vertical cell diodes D may be formed using substantially the same method as described previously with reference to FIGS. 8A and 8B. As a result, each of the vertical cell diodes D may be formed to include an n-type semiconductor 61n and a p-type semiconductor 61p. Cell diode electrodes 63 may be formed on top surfaces of the vertical cell diodes D. The cell diode electrodes 63 may also be formed using substantially the same method as described previously with reference to FIGS. 8A and 8B.

Insulating spacers 65 may be formed on sidewalls of the upper cell contact holes 57b using a conventional method. The insulating spacers 65 may be formed of an insulating layer having an etch selectivity with respect to the sacrificial layer 57. For example, the insulating spacers 65 may be formed of a silicon oxide layer. The cell diode electrodes 63 may be formed after formation of the insulating spacers 65 as described previously with reference to FIGS. 9A and 9B.

A bottom electrode layer may be formed on the substrate 51 in a region including the cell diode electrodes 63 and the insulating spacers 65, and the bottom electrode layer may be planarized to expose a top surface of the sacrificial layer 57. As a result, preliminary bottom electrodes 67 contacting the cell diode electrodes 63 may be formed in the upper cell contact holes 57b surrounded by the insulating spacers 65. The bottom electrode layer may be formed of a conductive layer, such as a titanium nitride (TiN) layer, a titanium aluminum nitride (TiAlN) layer, a tantalum nitride (TaN) layer, a tungsten nitride (WN) layer, a molybdenum nitride (MoN) layer, a niobium nitride (NbN) layer, a titanium silicon nitride (TiSiN) layer, a titanium boron nitride (TiBN) layer, a zirconium silicon nitride (ZrSiN) layer, a tungsten silicon nitride (WSiN) layer, a tungsten boron nitride (WBN) layer, a zirconium aluminum nitride (ZrAlN) layer, a molybdenum aluminum nitride (MoAlN) layer, a tantalum silicon nitride (TaSiN) layer, a tantalum aluminum nitride (TaAlN) layer, a titanium tungsten (TiW) layer, a titanium aluminum (TiAl) layer, a titanium oxynitride (TiON) layer, a titanium aluminum oxynitride (TiAlON) layer, a tungsten oxynitride (WON) layer and/or a tantalum oxynitride (TaON) layer.

Figure 15A:
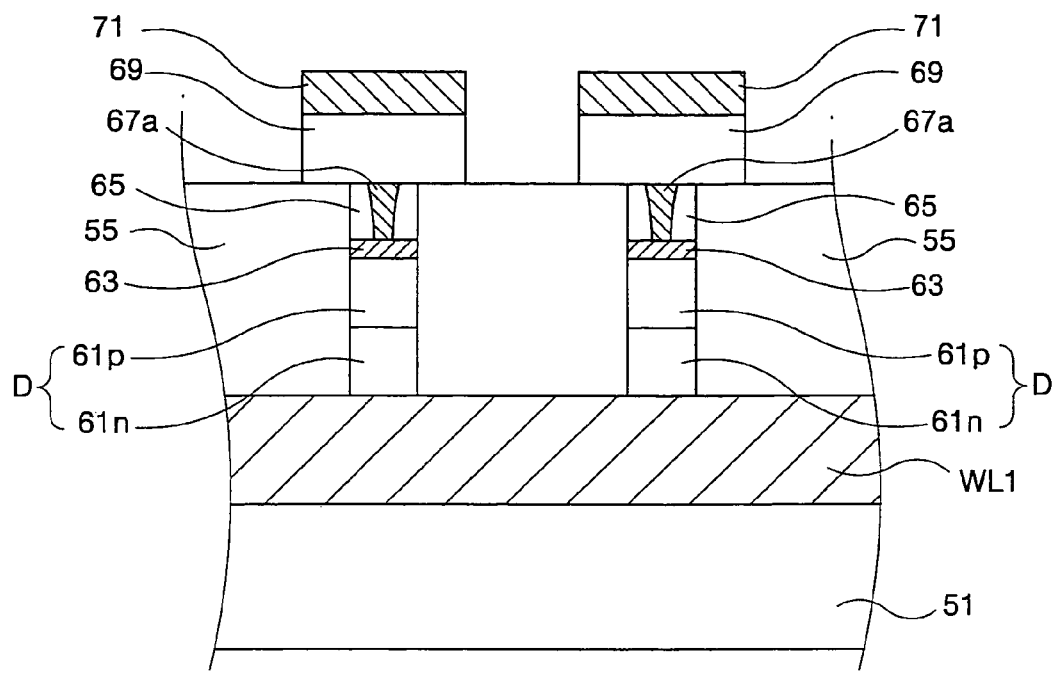
Figure 15B:
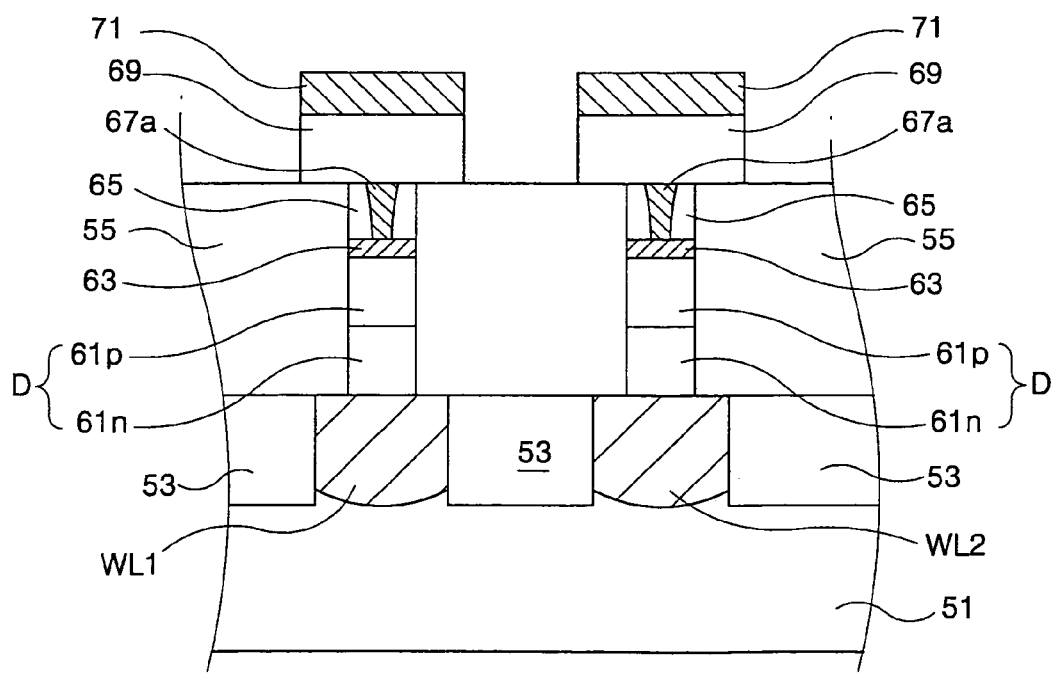

Referring now to FIGS. 15A and 15B, the sacrificial layer 57 is removed resulting in the preliminary bottom electrodes 67 and the insulating spacers 65 protruding above the lower insulating layer 55. The protruded preliminary bottom electrodes 67 and the protruded insulating spacers 65 may then be planarized using the lower insulating layer 55 as a polishing stop layer. As a result, bottom electrodes 67a may be formed on the vertical cell diodes D, and top surfaces of the bottom electrodes 67a may have substantially a same level as the top surface of the lower insulating layer 55. As a result, top surface areas of the bottom electrodes 67a may be smaller than the horizontal section areas of the vertical cell diodes D. Further, the bottom electrodes 67a may be self-aligned with the vertical cell diodes D.

Phase change material patterns 69 and top electrodes 71 may be formed on the substrate 51 in the region including the bottom electrodes 67a using substantially the same method as described previously with reference to FIGS. 10A and 10B. An upper insulating layer and bit lines may then be formed on the substrate 51 in the region including the top electrodes 71 using substantially the same method as described previously with reference to FIGS. 11A and 11B.

According to some embodiments of the present invention as described above, vertical cell diodes are provided in lower regions of cell contact holes and bottom electrodes are disposed on the vertical cell diodes. The bottom electrodes in some embodiments are self-aligned with the vertical cell diodes by the cell contact holes. Further, any additional photolithography process may not be required to form the bottom electrodes. As a result, an integration density of a phase change memory device including the vertical cell diodes may be increased without using more complicated processes. In addition, the bottom electrodes may be surrounded by insulating spacers and a lower insulating layer, which may be formed of a silicon oxide layer exhibiting lower heat conductivity than a silicon nitride layer and a silicon oxynitride layer. As a result, in some embodiments, loss of joule heat generated from the bottom electrodes may be reduced, which may improve a program efficiency of the phase change material patterns contacting the bottom electrodes.

In various of the embodiments described above, the first lower insulating layer 5 and the lower insulating layer 55 may be formed of a silicon oxide layer, such as a high density plasma (HDP) oxide layer. In such embodiments, a physical stress from the insulating layer 5 or 55 may be directly applied to the vertical diode D, which may generate crystalline defects in the vertical diode D. When the crystalline defects are generated in the vertical diode D (particularly, at an interface between the p-type and n-type semiconductors 13p and 13n or between the p-type and n-type semiconductors 61p and 61n), the leakage current of the vertical diode D may be significantly increased under a reverse bias condition. Therefore, in some embodiments, the physical stress from the insulating layer 5 or 55 may be alleviated, which may improve the reliability and electrical characteristics of the vertical diode D.

Figure 16:
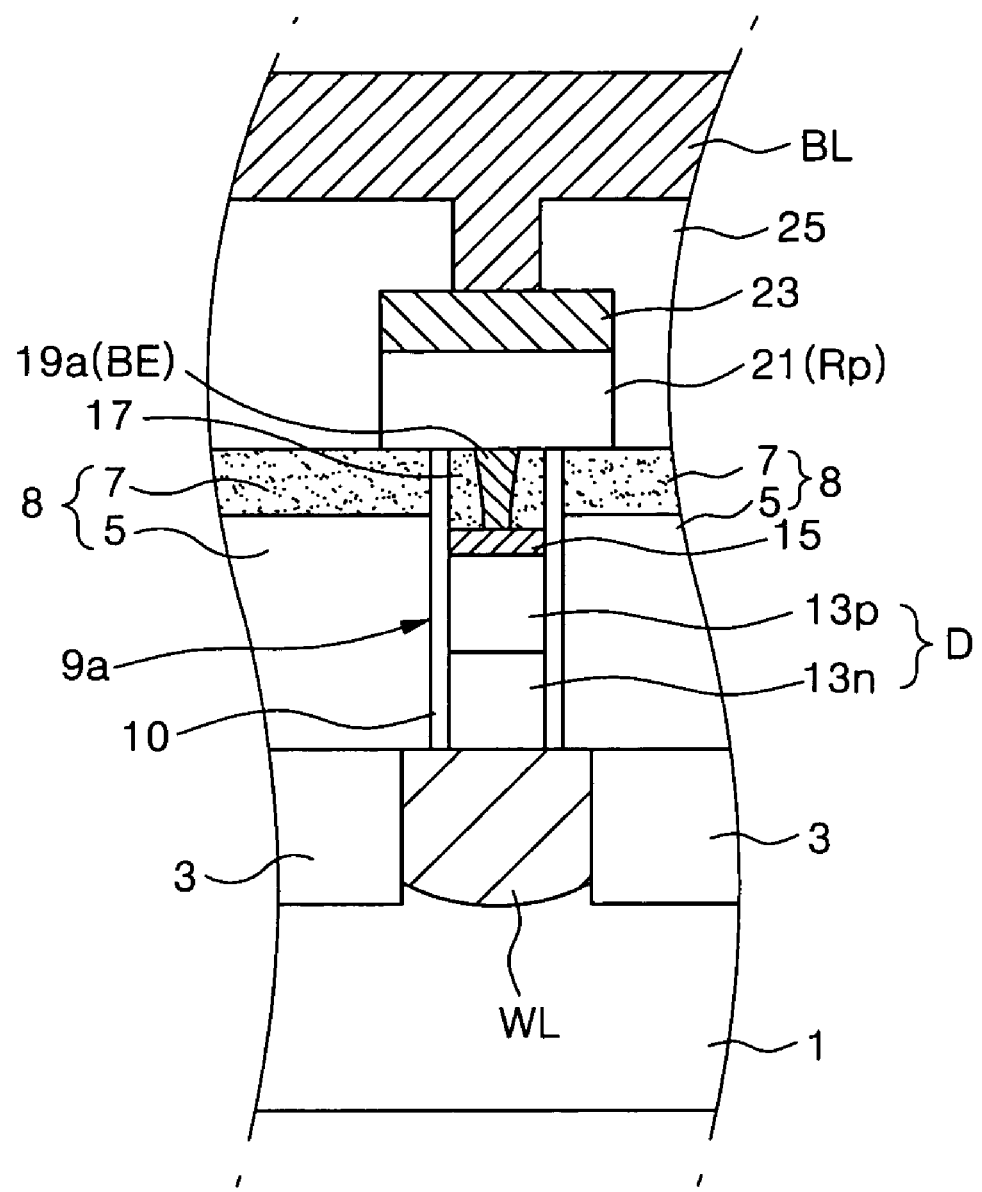
FIG. 16 is a cross-sectional view illustrating a phase change memory cell according to other embodiments of the present invention.
Figure 17:
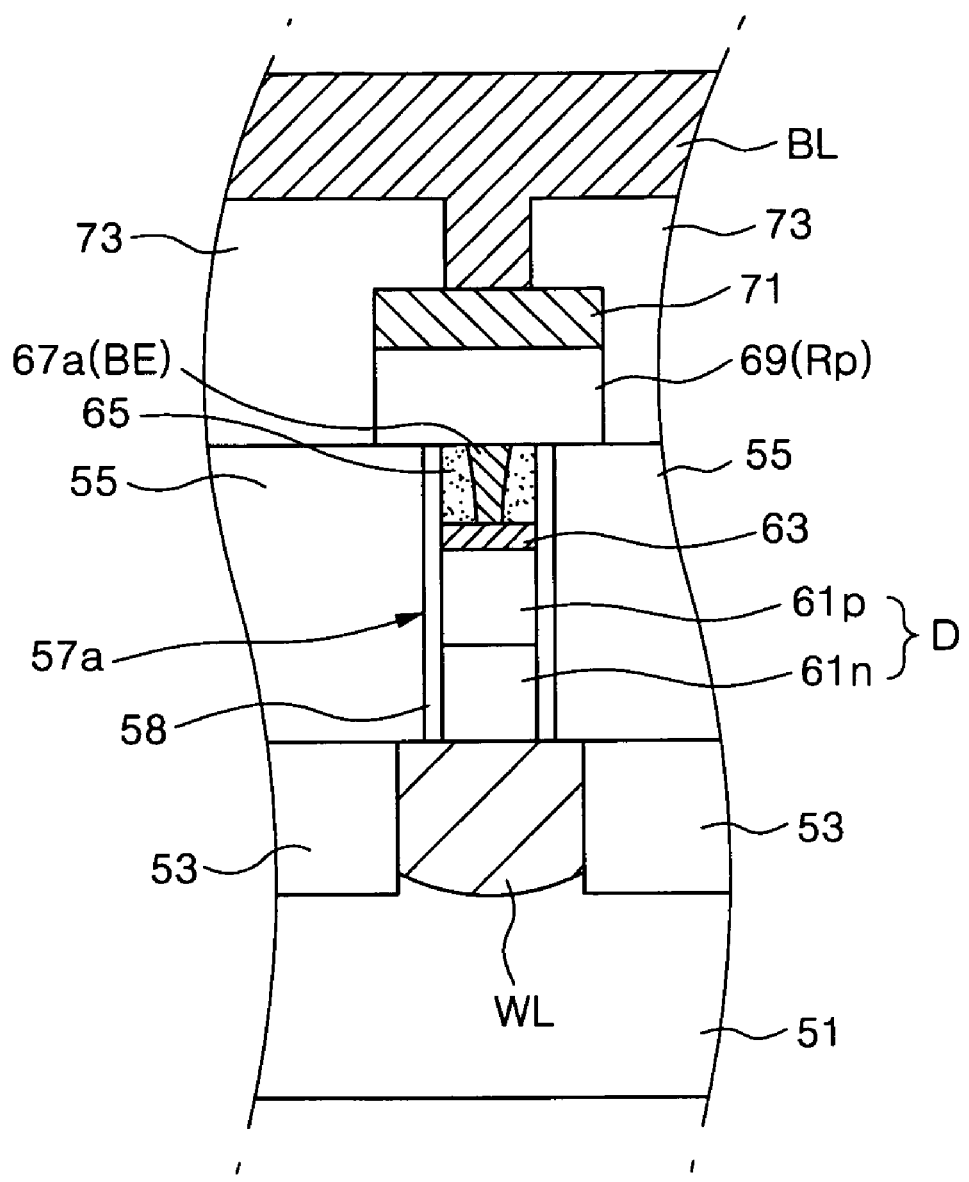
FIG. 17 is a cross-sectional view illustrating a phase change memory cell according to yet other embodiments of the present invention.

FIGS. 16 and 17 are cross-sectional views illustrating phase change memory cells configured to reduce the physical stress applied to the phase change memory cell diode according to some embodiments of the present invention. Referring to FIG. 16, the illustrated embodiments of the phase change memory cell may include a stress buffer spacer 10 in addition to the like numbered items of the phase change memory cell described previously with reference to the embodiments of FIGS. 3A and 3B. The stress buffer spacer 10 may be provided between the vertical diode D and the first lower insulating layer 5. The stress buffer spacer 10 may be a layer of a material that is more porous than the first lower insulating layer 5. For example, in some embodiments, the first lower insulating layer 5 is a HDP oxide layer and the stress buffer spacer 10 is a medium temperature oxide (MTO) layer, which may be formed using a low pressure chemical vapor deposition (LPCVD) technique. In such embodiments, the stress buffer spacer 10 may relieve the physical stress from the first lower insulating layer 5. As a result, the reliability and/or the electrical characteristic of the vertical diode D may be improved due to the presence of the stress buffer spacer 10.

The stress buffer spacer 10 may extend to surround an outer sidewall of the bottom electrode 19a. In addition, when the insulating spacer 17 is provided as seen in FIG. 16, the stress buffer spacer 10 may extend to surround an outer sidewall of the insulating spacer 17. In some embodiments, the top surface of the bottom electrode 19a may be lower than that of the insulating layer 8 and the phase change material pattern 21 may have a confined shape.

Methods of fabricating the phase change memory cell shown in FIG. 16 may include forming the stress buffer spacer 10 in addition to the fabrication method operations previously described with reference to the embodiments of FIGS. 5A to 11A and FIGS. 5B to 11B. For the phase change memory cell illustrated in FIG. 16, the stress buffer spacer 10 may be formed on a sidewall of the cell contact hole 9a prior to formation of the semiconductor pattern 11 as described previously with reference to FIGS. 7A and 7B. The stress buffer spacer 10 may be formed of a more porous material layer than the first lower insulating layer 5. For example, in some embodiments, the first lower insulating layer 5 is formed of a HDP oxide layer and the stress buffer spacer 10 is formed of a medium temperature oxide (MTO) layer, for example, by using a low pressure chemical vapor deposition (LPCVD) technique.

Referring now to the embodiments illustrated in FIG. 17, the phase change memory cell may include a stress buffer spacer 58 in addition to the like numbered items of the phase change memory cell according to the embodiment described previously with reference to FIGS. 4A and 4B. The stress buffer spacer 58 may be provided between the vertical diode D and the lower insulating layer 55. The lower insulating layer 55 may be the same material layer as the first lower insulating layer 5 shown in FIG. 16, and the stress buffer spacer 58 may be the same material layer as the stress buffer spacer 10 shown in FIG. 16. Accordingly, the reliability and/or the electrical characteristic of the vertical diode D may be improved due to the presence of the stress buffer spacer 58.

The stress buffer spacer 58 may also extend to surround an outer sidewall of the insulating spacer 65 and/or an outer sidewall of the bottom electrode 67a, as shown in FIG. 17. In some embodiments, the top surface of the bottom electrode 67a may be lower than that of the lower insulating layer 55 and the phase change material pattern 69 may have a confined shape.

Methods of fabricating the phase change memory cell shown in FIG. 17 may include forming the stress buffer spacer 58 in addition to the fabrication method operations previously described with reference to the embodiments of FIGS. 12A to 15A and FIGS. 12B to 15B. For the phase change memory cell illustrated in FIG. 17, the stress buffer spacer 58 may be formed on a sidewall of the cell contact hole 57a prior to formation of the recessed semiconductor pattern 59a as described previously with reference to FIGS. 13A and 13B. The lower insulating layer 55 may be formed of the same material layer as the first lower insulating layer 5 shown in FIG. 16, and the stress buffer spacer 58 may also be formed of the same material layer as the stress buffer spacer 10 shown in FIG. 16.

Thus, according to the embodiments of the present invention, reliability and/or electrical characteristics of a phase change memory cell diode may be greatly improved by disposing a stress buffer spacer between the cell diode and the insulating layer.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. An integrated circuit device comprising:
   an integrated circuit substrate;
   an insulating layer on the integrated circuit substrate;
   a contact hole penetrating the insulating layer;
   a vertical diode in the contact hole; and
   a stress buffer spacer between the vertical diode and the insulating layer.

2. The device of claim 1, wherein the insulating layer comprises:
   a first insulating layer on the integrated circuit substrate; and
   a second insulating layer on the first insulating layer, the second insulating layer having an etch selectivity with respect to the first insulating layer.

3. The device of claim 1, further comprising a bottom electrode in the contact hole on the vertical diode.

4. The device of claim 3, wherein the bottom electrode is self-aligned with the vertical diode.

5. The device of claim 3, wherein a top surface of the bottom electrode has a lower level than a top surface of the insulating layer.

6. The device of claim 3, further comprising a diode electrode between the vertical diode and the bottom electrode.

7. The device of claim 3, further comprising:
   a phase change material pattern on the bottom electrode; and
   a top electrode on the phase change material pattern.

8. The device of claim 3, wherein the stress buffer spacer extends to surround an outer sidewall of the bottom electrode and wherein the bottom electrode has a top surface area that is less than a horizontal section area of the contact hole.

9. The device of claim 8, further comprising an insulating spacer between the bottom electrode and the stress buffer spacer.

10. The device of claim 1, wherein the insulating layer comprises a high density plasma (HDP) oxide layer.

11. The device of claim 1, wherein the stress buffer spacer comprises a material layer that is more porous than the insulating layer.

12. The device of claim 11, wherein the stress buffer spacer comprises a low pressure chemical vapor deposition (LPCVD) oxide layer.

13. The device of claim 12, wherein the LPCVD oxide layer comprises a medium temperature oxide (MTO) layer.

14. The device of claim 1, wherein the vertical diode comprises a single crystalline semiconductor.

15. A method of fabricating an integrated circuit device, the method comprising:
   forming an insulating layer on an integrated circuit substrate;
   forming a cell contact hole penetrating the insulating layer;

forming a stress buffer spacer on a sidewall of the cell contact hole; and forming a vertical diode in the cell contact hole surrounded by the stress buffer spacer.

16. The method of claim 15, wherein forming the insulating layer comprises forming a high density plasma (HDP) oxide layer.

17. The method of claim 15, wherein forming the stress buffer spacer comprises forming a material layer that is more porous than the insulating layer.

18. The method of claim 17, wherein forming the stress buffer spacer comprises forming the stress buffer layer as an oxide layer using a low pressure chemical vapor deposition (LPCVD) process.

19. The method of claim 18, wherein the oxide layer is a medium temperature oxide (MTO) layer.

20. The method of claim 15, wherein forming the vertical diode comprises forming the vertical diode from a single crystalline semiconductor.

21. The method of claim 20, wherein forming the vertical diode includes forming the single crystalline semiconductor using a selective epitaxial growth (SEG) process.

22. The method of claim 15, wherein forming the vertical diode comprises forming the vertical cell diode in a lower region of the cell contact hole and wherein forming the vertical diode is followed by forming a diode electrode in the cell contact hole on a top surface of the vertical diode.

23. The method of claim 15, wherein forming the vertical diode comprises forming the vertical cell diode in a lower region of the cell contact hole and wherein forming the vertical diode is followed by forming a bottom electrode in the cell contact hole on the vertical diode.

24. The method of claim 23, wherein forming the bottom electrode is preceded by forming an insulating spacer on a sidewall of the cell contact hole above the vertical diode prior to formation of the bottom electrode and wherein forming the bottom electrode comprises forming the bottom electrode with the insulating spacer between the bottom electrode and the stress buffer spacer.

25. The method of claim 23, wherein forming the insulating layer comprises sequentially stacking a lower insulating layer and a sacrificial layer and wherein the method further comprises:

removing the sacrificial layer after formation of the bottom electrode so that the bottom electrode and the stress buffer spacer protrude from the lower insulating layer; and planarizing the protruded bottom electrode and the protruded stress buffer spacer.

26. The method of claim 23, wherein forming the bottom electrode is followed by:

forming a phase change material pattern on the bottom electrode; and forming a top electrode on the phase change material pattern.

27. A semiconductor memory device comprising:
an integrated circuit substrate;
a first insulating layer on the integrated circuit substrate;
a vertical diode formed in the first insulating layer;
a diode electrode formed on the vertical diode and located in the first insulating layer;
a second insulating layer on the first insulating layer, the second insulating layer having an etching selectivity with respect to the first insulating layer;
a bottom electrode extending through the second insulating layer to at least a portion of the diode electrode;
a stress buffer spacer between the vertical diode and the first insulating layer;
a phase change material pattern on the bottom electrode and the second insulating layer; and
a top electrode on the phase change material pattern.

28. The device of claim 27, wherein the first insulating layer comprises a silicon oxide layer.

29. The device of claim 27, wherein the second insulating layer comprises a silicon nitride layer and/or a silicon oxynitride layer.

30. The device of claim 27, further comprising an insulating spacer between the bottom electrode and the second insulating layer.

31. The device of claim 30, wherein the insulating spacer comprises a silicon nitride layer and/or a silicon oxynitride layer.

32. The device of claim 27, wherein the bottom electrode comprises one of TiN, TiAlN, TaN, WN, MoN, NbN, TiSiN, TiBN, ZrSiN, WSiN, WBN, ZrAlN, MoAlN, TaSiN, TaAlN, TiW, TiAl, TiON, TiAlON, WON and TaON.

33. A semiconductor device comprising:
an integrated circuit substrate;
an insulating layer on the integrated circuit substrate;
a vertical diode formed in the insulating layer;
a diode electrode formed on the vertical diode and located in the insulating layer;
a silicon nitride layer and/or a silicon oxynitride layer on the insulating layer;
a bottom electrode extending through the silicon nitride layer and/or a silicon oxynitride layer to at least a portion of the diode electrode;
a stress buffer spacer between the vertical diode and the insulating layer;
a phase change material pattern on the bottom electrode and the silicon nitride layer and/or a silicon oxynitride layer; and
a top electrode on the phase change material pattern.

34. The device of claim 33, further comprising an insulating spacer between the bottom electrode and the silicon nitride layer and/or a silicon oxynitride layer.

35. The device of claim 34, wherein the insulating spacer comprises a silicon nitride layer and/or a silicon oxynitride layer.

36. A semiconductor device comprising:
an integrated circuit substrate;
a first insulating layer on the integrated circuit substrate;
a second insulating layer on the first insulating layer;
a conductive structure extending through the second insulating layer and the first insulating layer to the integrated circuit substrate;
a first insulating spacer between the conductive structure and the first insulating layer;
a phase change material pattern on the conductive structure; and
a top electrode on the phase change material pattern.

37. The device of claim 36, wherein the conductive structure has a top surface area that is less than a bottom surface area of the conductive structure.

38. The device of claim 36, wherein the conductive structure comprises a vertical diode.

39. The device of claim 38, wherein the conductive structure further comprises a diode electrode on the vertical diode.

40. The device of claim 39, wherein the conductive structure further comprises a bottom electrode on the diode electrode.

41. The device of claim 36, wherein the second insulating layer comprises a silicon nitride layer and/or a silicon oxynitride layer.

42. The device of claim 36, further comprising a second insulating spacer between the conductive structure and the second insulating layer.

43. The device of claim 42, wherein the second insulating spacer comprises a silicon nitride layer and/or a silicon oxynitride layer.

* * * * *